(12) United States Patent
Kinoshita

(10) Patent No.: US 7,816,066 B2
(45) Date of Patent: Oct. 19, 2010

(54) POSITIVE RESIST COMPOSITION AND METHOD FOR FORMING RESIST PATTERN

(75) Inventor: Yohei Kinoshita, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 175 days.

(21) Appl. No.: 11/911,953

(22) PCT Filed: Apr. 7, 2006

(86) PCT No.: PCT/JP2006/307478
§ 371 (c)(1),
(2), (4) Date: Oct. 18, 2007

(87) PCT Pub. No.: WO2006/115017
PCT Pub. Date: Nov. 2, 2006

(65) Prior Publication Data
US 2009/0068583 A1 Mar. 12, 2009

(30) Foreign Application Priority Data
Apr. 20, 2005 (JP) .............................. 2005-122710

(51) Int. Cl.
*G03F 7/004* (2006.01)
*G03F 7/30* (2006.01)
(52) U.S. Cl. .................... 430/270.1; 430/326; 430/910; 430/921; 430/922
(58) Field of Classification Search ............... 430/270.1, 430/326, 921, 922
See application file for complete search history.

(56) References Cited

U.S. PATENT DOCUMENTS

| 6,548,220 | B2 * | 4/2003 | Uetani et al. ............. 430/270.1 |
| 6,602,647 | B2 * | 8/2003 | Iwasa et al. ............. 430/270.1 |
| 6,638,685 | B2 * | 10/2003 | Maeda et al. ............ 430/270.1 |
| 6,849,384 | B2 * | 2/2005 | Iwasa et al. ............. 430/281.1 |
| 6,982,140 | B2 | 1/2006 | Hada et al. |
| 7,189,492 | B2 * | 3/2007 | Kodama et al. ........... 430/270.1 |
| 7,371,503 | B2 * | 5/2008 | Miyamatsu et al. ...... 430/270.1 |
| 2004/0224251 | A1 * | 11/2004 | Toishi et al. ............. 430/270.1 |
| 2005/0095532 | A1 * | 5/2005 | Kodama et al. .......... 430/270.1 |
| 2006/0040203 | A1 | 2/2006 | Kodama et al. |

FOREIGN PATENT DOCUMENTS

| EP | 1586570 | 10/2005 |
| JP | 2003005372 | 1/2003 |
| JP | 2003-307850 | 10/2003 |

OTHER PUBLICATIONS

International Search Report from PCT/JP2006/307478, mailed May 2, 2006.
Office Action issued on counterpart Chinese Application No. 200680019830.2, dated Aug. 17, 2010.

* cited by examiner

*Primary Examiner*—John S Chu
(74) *Attorney, Agent, or Firm*—Knobbe, Martens, Olson & Bear, LLP

(57) ABSTRACT

A positive resist composition includes a resin component (A), and an acid generator component (B) which generates an acid upon exposure and includes an acid generator (B1) represented by general formula (B1):

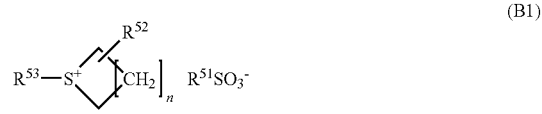

(B1)

(wherein $R^{51}$ represents a straight chain, branched chain, or cyclic alkyl group, or a straight chain, branched chain, or cyclic fluorinated alkyl group; $R^{52}$ represents a hydrogen atom, a hydroxyl group, a halogen atom, a straight chain, branched chain, or cyclic alkyl group, a straight chain or branched chain halogenated alkyl group, or a straight chain or branched chain alkoxy group; $R^{53}$ represents an aryl group which may include a substituent; and n represents an integer from 1 to 3).

10 Claims, No Drawings

POSITIVE RESIST COMPOSITION AND METHOD FOR FORMING RESIST PATTERN

RELATED APPLICATIONS

This application is the U.S. National Phase filing under 35 U.S.C. §371 of PCT/JP2006/307478, filed Apr. 7, 2006, which designated the United States and was published in a language other than English, which claims priority under 35 U.S.C. §119(a)-(d) to Japanese Patent Application No. 2005-122710, filed Apr. 20, 2005. The content of these applications is incorporated herein by reference in their entireties.

TECHNICAL FIELD

The present invention relates to a positive resist composition and a method for forming a resist pattern.

BACKGROUND ART

In recent years, in the production of semiconductor elements and liquid crystal display elements, advances in lithography techniques have lead to rapid progress in the field of miniaturization. Typically, these miniaturization techniques involve shortening the wavelength of the exposure light source. Specifically, ultraviolet radiation such as g-line and i-line radiation has conventionally been used, but nowadays KrF excimer laser (248 nm) is mainly mass-produced and also ArF excimer laser (193 nm) has begun to be introduced in mass production.

In the resist for such a shorter wavelength light source, high resolution which enables reproduction of a pattern of minute dimensions, and higher sensitivity to such a shorter wavelength light source are required. One example of a resist material that satisfies these conditions is a chemically amplified resist composition including a base resin and an acid generator (PAG) which generates an acid upon exposure. Chemically amplified resist compositions include positive compositions in which alkali solubility increases, and negative compositions in which alkali solubility decreases.

Examples of PAG that has been used in chemically amplified resist compositions are onium salts, and a multitude of onium salts have conventionally been proposed. In patent document 1 shown below, PAG comprising a triphenylsulfonium onium salt is described. Of these acid generators, an onium salt acid generator containing fluorinated alkylsulfonic acid ions as an anion (acid), such as triphenylsulfonium nonafluorobutane sulfonate (TPS-PFBS), is used most commonly.

[Patent document 1]
Japanese Unexamined Patent Application, First Publication No. 2003-167347

DISCLOSURE OF THE INVENTION

However, in a conventional chemically amplified positive resist composition, the shape of the resist pattern may develop a tapered shape (footing) or T-top shape, meaning a resist pattern with favorable rectangular (rectangularity) formability is unobtainable.

The present invention has been made so as to solve the above problems, with an object of providing a chemically amplified positive resist composition which enables formation of a pattern having a favorable shape, and a method for forming a resist pattern.

In order to achieve the above object, the present invention adopts the constitutions described below.

In a first aspect of the present invention, a positive resist composition includes a resin component (A) which contains an acid dissociable, dissolution inhibiting group and exhibits increased alkali solubility under an action of an acid, and an acid generator component (B) which generates an acid upon exposure and includes an acid generator (B1) represented by general formula (B1):

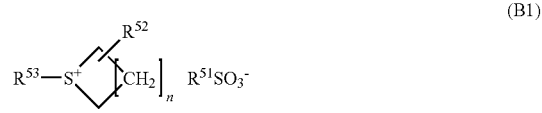

(B1)

(wherein $R^{51}$ represents a straight chain, branched chain, or cyclic alkyl group, or a straight chain, branched chain, or cyclic fluorinated alkyl group; $R^{52}$ represents a hydrogen atom, a hydroxyl group, a halogen atom, a straight chain, branched chain, or cyclic alkyl group, a straight chain or branched chain halogenated alkyl group, or a straight chain or branched chain alkoxy group; $R^{53}$ represents an aryl group which may include a substituent; and n represents an integer from 1 to 3).

In a second aspect of the present invention, a method for forming a resist pattern includes the steps of:

forming a positive resist film on a substrate using a resist composition in the first aspect of the present invention;
selectively exposing said resist film; and
alkali-developing said resist film, thereby forming a resist pattern.

The present invention can provide a chemically amplified positive resist composition which enables formation of a pattern having a favorable shape, and a method for forming a resist pattern.

BEST MODE FOR CARRYING OUT THE INVENTION

[Positive Resist Composition]

Resin Component (A)

The resin component (A) (hereinafter referred sometimes to as component (A)) is an alkali-insoluble compound containing so-called acid-dissociable, dissolution-inhibiting groups, and when an acid is generated from the acid generator component (B) (hereinafter referred sometimes to component (B)) upon exposure, this acid causes the acid-dissociable, dissolution-inhibiting groups to dissociate, causing the component (A) to become alkali-soluble.

During resist pattern formation, by selectively exposing the resist composition applied to the surface of a substrate, the alkali solubility of the exposed portions is increased, and thus alkali developing can then be conducted.

There are no particular restrictions on the component (A), provided it is a resin that is able to be used as a base resin for a chemically amplified positive resist composition in the manner described above.

—Structural Unit (a1)

The component (A) preferably contains a structural unit (a1) derived from an acrylate ester which contains an acid-dissociable, dissolution-inhibiting group.

In the description of examples of the following positive resist composition, the terms are as defined below. A "structural unit" refers to a monomer unit which contributes to the formation of a polymer (resin).

A "structural unit derived from acrylic acid" refers to a structural unit formed by cleavage of the ethylenic double bond of the acrylic acid.

A "structural unit derived from an acrylate ester" refers to a structural unit formed by cleavage of the ethylenic double bond of an acrylate ester.

Unless stated otherwise, the term "α-position (α-position carbon atom)" of a "structural unit derived from acrylic acid" and a "structural unit derived from an acrylate ester" refers to the carbon atom to which the carbonyl group is bonded.

The "structural unit derived from an acrylate ester" is used as a general concept which includes a structural unit in which a hydrogen atom bonded to the α-position carbon atom is substituted with another substituent group such as a halogen atom, an alkyl group, or a halogenated alkyl group, and a structural unit derived from an acrylate ester in which a hydrogen atom is bonded to the α-position carbon atom.

An "alkyl group", unless stated otherwise, includes straight chain, cyclic, or branched chain alkyl groups.

A "lower alkyl group", unless stated otherwise, includes straight chain or branched chain alkyl groups.

The acid-dissociable, dissolution-inhibiting group in the structural unit (a1) can use any of the groups that have been proposed as acid-dissociable, dissolution-inhibiting groups for the base resins of chemically amplified resists, provided the group has an alkali dissolution-inhibiting effect that renders the entire component (A) alkali-insoluble prior to exposure, and then following dissociation, causes the entire component (A) to change to an alkali-soluble state. Generally, groups that form either a cyclic or chain-like tertiary alkyl ester, or form a cyclic or a chain-like or alkoxyalkyl ester group with the carboxyl group of (meth)acrylic acid are the most widely known. Of these groups, a group that forms a cyclic or chain-like tertiary alkyl ester with the carboxyl group of (meth)acrylic acid is more preferable.

The term "(meth)acrylate ester" is a generic term that includes either one of, or both, an acrylate ester and a methacrylate ester.

Here, a "tertiary alkyl ester" describes a structure in which an ester is formed by substituting the hydrogen atom of the carboxyl group with an alkyl group or a cycloalkyl group, and the tertiary carbon atom of the alkyl group or the cycloalkyl group is bonded to the oxygen atom at the terminal of the carbonyloxy group (—C(O)—O—) of the ester. In this tertiary alkyl ester, the action of acid causes cleavage of the bond between the oxygen atom and the tertiary carbon atom.

The alkyl group or the cycloalkyl group may include a substituent.

The group that forms the tertiary alkyl ester with the carboxyl group, thereby exhibiting acid dissociability, is referred to as a "tertiary alkyl ester type acid dissociable, dissolution inhibiting groups" for convenience sake.

A "cyclic or chain-like alkoxyalkyl ester" describes a structure in which an ester is formed by substituting the hydrogen atom of the carboxyl group with an alkoxyalkyl group, and the alkoxyalkyl group is bonded to the oxygen atom at the terminal of the carbonyloxy group (—C(O)—O—) of the ester. In this alkoxyalkyl ester, the action of acid causes cleavage of the bond between the oxygen atom and the alkoxyalkyl group.

The structural unit (a1) is preferably at least one unit selected from the group consisting of structural units represented by general formulas (a1-0-1) and (a1-0-2) shown below.

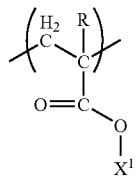

(a1-0-1)

(wherein R represents a hydrogen atom, a fluorine atom, a lower alkyl group, or a fluorinated lower alkyl group; and $X^1$ represents an acid dissociable, dissolution inhibiting group.)

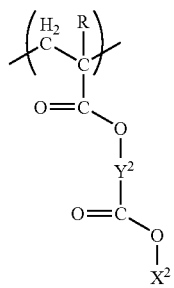

(a1-0-2)

(wherein R is as defined above; $X^2$ represents an acid dissociable, dissolution inhibiting group; and $Y^2$ represents an aliphatic cyclic group.)

In general formula (a1-0-1), the lower alkyl group represented by R is an alkyl group of 1 to 5 carbon atoms, and specific examples include a lower straight chain or branched chain alkyl group, such as a methyl group, an ethyl group, a propyl group, an isopropyl group, an n-butyl group, an isobutyl group, a tert-butyl group, a pentyl group, an isopentyl group, or a neopentyl group.

The fluorinated lower alkyl group represented by R is an alkyl group of 1 to 5 carbon atoms, in which either a portion of, or all of, the hydrogen atoms of the alkyl group may be substituted with a fluorine atom, and all of the hydrogen atoms of the alkyl group are preferably fluorinated.

The fluorinated lower alkyl group of 1 to 5 carbon atoms is preferably a trifluoromethyl group, hexafluoroethyl group, heptafluoropropyl group, or nonafluorobutyl group, and more preferably a trifluoromethyl group.

There are no particular restrictions on $X^1$, provided that it is an acid dissociable, dissolution inhibiting group, and includes, for example, alkoxyalkyl group type and tertiary alkyl ester type acid dissociable, dissolution inhibiting groups, although a tertiary alkyl ester type acid dissociable, dissolution inhibiting group is preferable. Examples of the tertiary alkyl ester type acid dissociable, dissolution inhibiting group include an aliphatic branched chain acid dissociable, dissolution inhibiting group and an acid dissociable, dissolution inhibiting group containing an aliphatic cyclic group.

In the claims and specification, the term "aliphatic" is a relative concept used in relation to the term "aromatic", and defines a group or compound or the like that contains no aromaticity. The term "aliphatic cyclic group" describes a monocyclic group or polycyclic group that contains no aromaticity.

An "aliphatic cyclic group" in the structural unit (a1) may include a substituent. Examples of the substituent include a lower alkyl group of 1 to 5 carbon atoms, a fluorine atom, a fluorinated lower alkyl group of 1 to 5 carbon atoms substituted with a fluorine atom, or an oxygen atom (=O).

Although the "aliphatic cyclic group" having a basic ring structure in which the substituent has been removed need not necessarily be a group formed solely from carbon and hydrogen (namely, a hydrocarbon group), a hydrocarbon group is preferred. Furthermore, the "hydrocarbon group" may be either saturated or unsaturated, but is preferably saturated. A polycyclic group is particularly preferred.

Specific examples of this type of aliphatic cyclic group include groups in which one or more hydrogen atoms have been removed from a polycycloalkane such as a monocycloalkane, bicycloalkane, tricycloalkane or tetracycloalkane, which may be substituted with a lower alkyl group, a fluorine atom, or a fluorinated alkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane.

Specific examples of the aliphatic branched chain acid dissociable, dissolution inhibiting group include a tert-butyl group and a tert-amyl group.

The acid dissociable, dissolution inhibiting group containing an aliphatic cyclic group includes, for example, a group containing a tertiary carbon atom on a ring skeleton of a cycloalkyl group, and specific examples include a 2-methyladamantyl group and a 2-ethyladamantyl group. Alternately, like a structural unit represented by general formula shown below, a group containing an aliphatic cyclic group such as an adamantyl group, and a branched chain alkylene group containing a tertiary carbon atom bonded thereto.

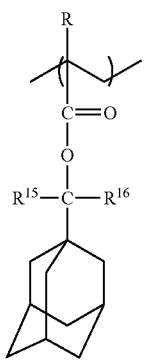

(wherein R is as defined above, and $R^{15}$ and $R^{16}$ represent an alkyl group (may be either straight chain or branched chain, and is preferably a group of 1 to 5 carbon atoms))

The alkoxyalkyl group is preferably a group represented by general formula shown below.

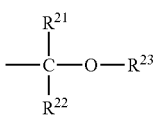

(wherein $R^{21}$ and $R^{22}$ each represents, independently, a straight chain or branched chain alkyl group, or a hydrogen atom, and $R^{23}$ represents a straight chain or branched chain alkyl group or cycloalkyl group, or the terminal of $R^{21}$ may be bonded to the terminal of $R^{23}$, thereby forming a ring)

In $R^{21}$ and $R^{22}$, the straight chain or branched chain alkyl group is preferably a group of 1 to 15 carbon atoms and may be either straight chain or branched chain, although an ethyl group and a methyl group are preferable, and a methyl group is most preferable. It is particularly preferred that one of $R^{21}$ and $R^{22}$ is a hydrogen atom and the other is a methyl group.

$R^{23}$ is a straight chain or branched chain alkyl group or cycloalkyl group and is preferably a group of 1 to 15 carbon atoms, and may be a straight chain, branched chain, or cyclic group.

When $R^{23}$ is a straight chain or branched chain group, it is preferably a group of 1 to 5 carbon atoms, although an ethyl group and a methyl group are more preferable, and an ethyl group is most preferable.

When $R^{23}$ is a cyclic group, it is preferably a group of 4 to 15 carbon atoms, more preferably 4 to 12 carbon atoms, and most preferably 5 to 10 carbon atoms. Specific examples of this type of cyclic group include groups in which one or more hydrogen atoms have been removed from a polycycloalkane such as a monocycloalkane, bicycloalkane, tricycloalkane or tetracycloalkane, which may be substituted with a fluorine atom or a fluorinated alkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane. Of these groups, a group in which one or more hydrogen atoms have been removed from adamantane is preferable.

In the formula shown above, $R^{21}$ and $R^{23}$ each represents, independently, an alkylene group of 1 to 5 carbon atoms and the terminal of $R^{23}$ may be bonded to the terminal of $R^{21}$.

In this case, a cyclic group is formed by $R^{21}$ and $R^{23}$, an oxygen atom to which $R^{23}$ is bonded, and the carbon atom to which the oxygen atom and $R^{21}$ are bonded. The cyclic ring is preferably a 4- to 7-membered ring, and more preferably a 4- to 6-membered ring. Specific examples of the cyclic group include a tetrahydropyranyl group and a tetrahydrofuranyl group.

In general formula (a1-0-2), R is as defined above. $X^2$ is the same as $X^1$ in formula (a1-0-1).

$Y^2$ is a divalent aliphatic cyclic group.

Since $Y^2$ is a divalent aliphatic cyclic group, except for the case of using a group in which two or more hydrogen atom have been removed, the same groups as those exemplified above in relation to the "aliphatic cyclic group" in the structural unit (a1) can be used.

More specifically, the structural unit (a1) includes structural units represented by general formulas (a1-1) to (a1-4).

(a1-1)

-continued

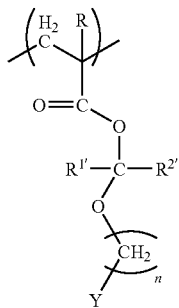
(a1-2)

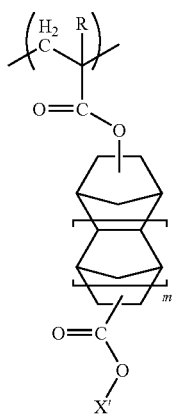
(a1-3)

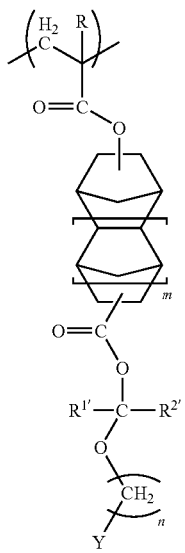
(a1-4)

(wherein X' represents a tertiary alkyl ester type acid dissociable, dissolution inhibiting group; Y represents a lower alkyl group of 1 to 5 carbon atoms, or an aliphatic cyclic group; n represents either 0 or an integer from 1 to 3; m represents 0 or 1; R is as defined above; and $R^{1\prime}$ and $R^{2\prime}$ each represents, independently, a hydrogen atom or a lower alkyl group of 1 to 5 carbon atoms.]

At least one of $R^{1\prime}$ and $R^{2\prime}$ is preferably a hydrogen atom, and more preferably both are hydrogen atoms. n is preferably either 0 or 1.

Examples of X' include the same tertiary alkyl ester type acid dissociable, dissolution inhibiting groups as those exemplified above in relation to the group $X^1$.

Examples of the aliphatic cyclic group represented by Y include the same groups as those exemplified in the description of the "aliphatic cyclic group" in the structural unit (a1) shown above.

Specific examples of the structural units represented by general formulas (a1-1) to (a1-4) are shown below.

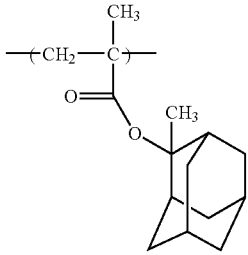
(a1-1-1)

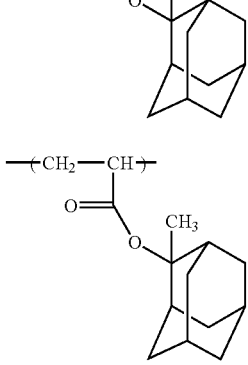
(a1-1-2)

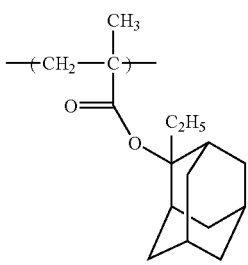
(a1-1-3)

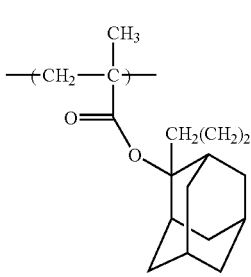
(a1-1-4)

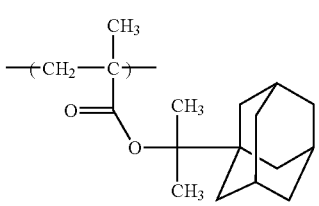
(a1-1-5)

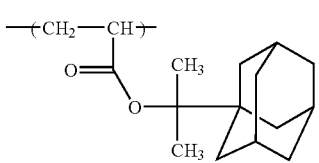
(a1-1-6)

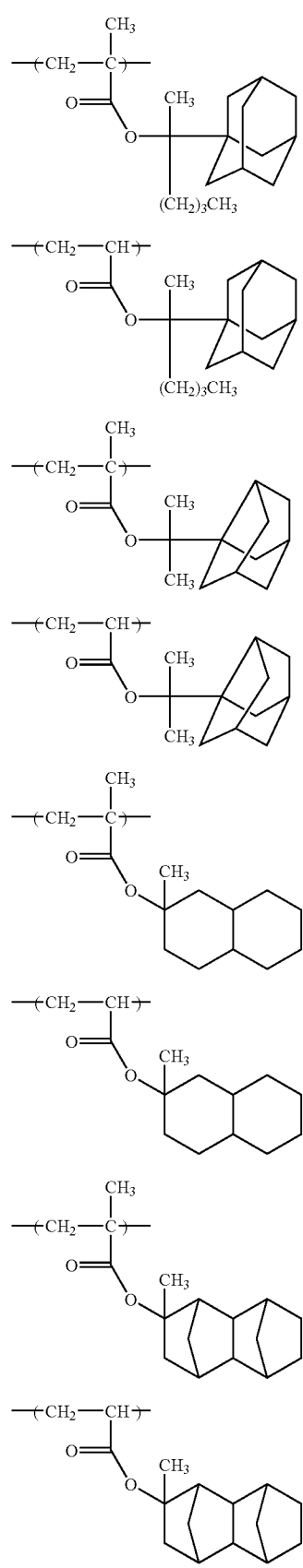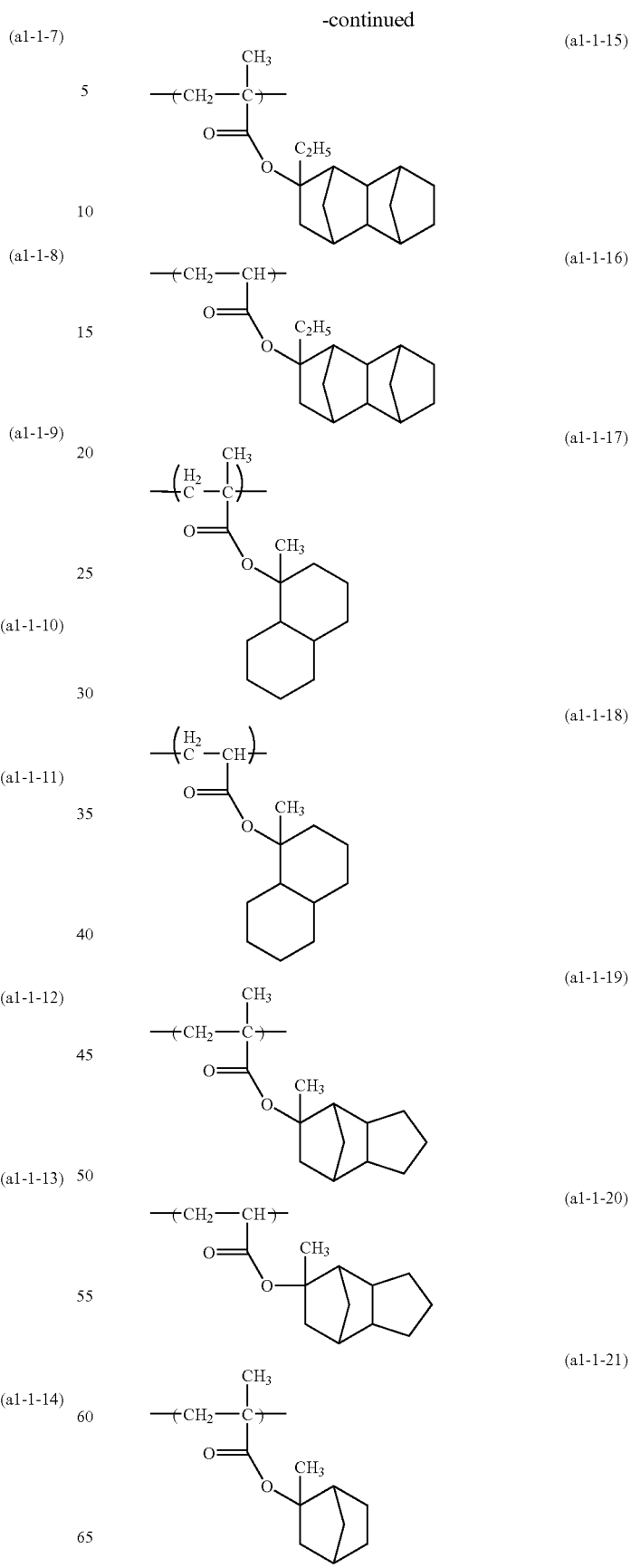

-continued
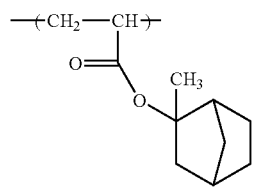
(a1-1-22)
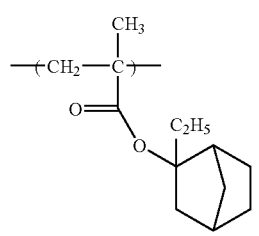
(a1-1-23)
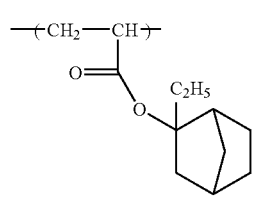
(a1-1-24)
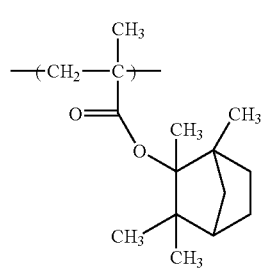
(a1-1-25)
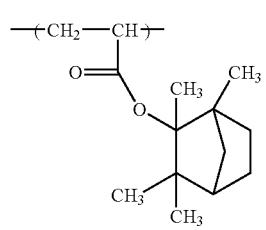
(a1-1-26)
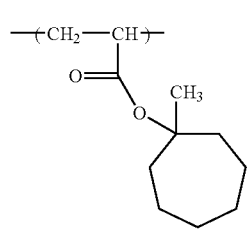
(a1-1-27)
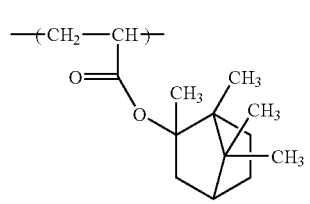
(a1-1-28)
-continued
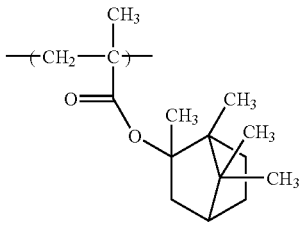
(a1-1-29)
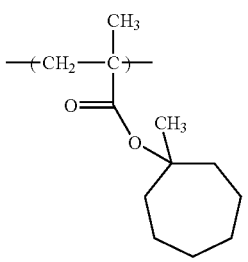
(a1-1-30)
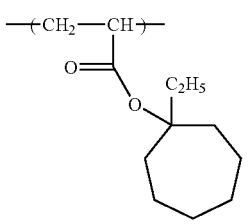
(a1-1-31)
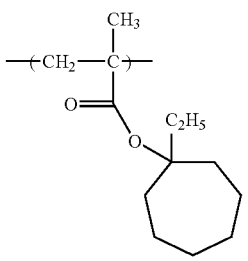
(a1-1-32)
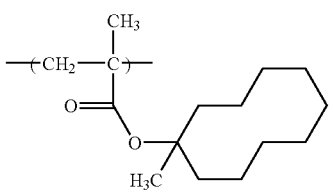
(a1-1-33)
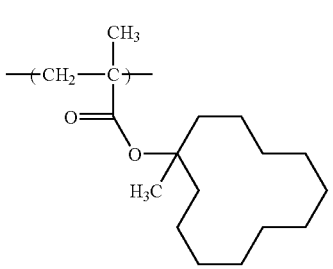
(a1-1-34)

-continued
(a1-1-35) 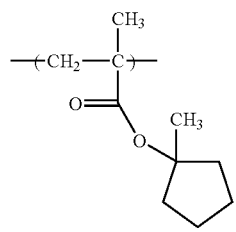
(a1-1-36) 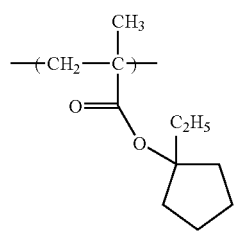
(a1-1-37) 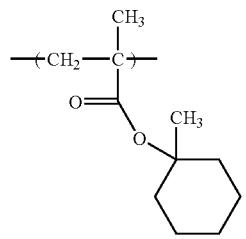
(a1-1-38) 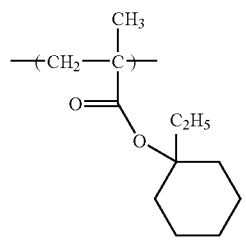
(a1-1-39) 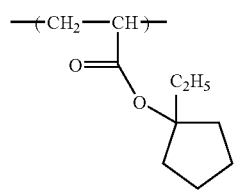
(a1-1-40) 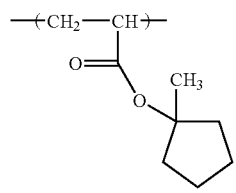
(a1-1-41) 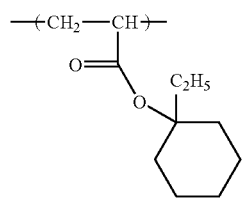
-continued
(a1-2-1) 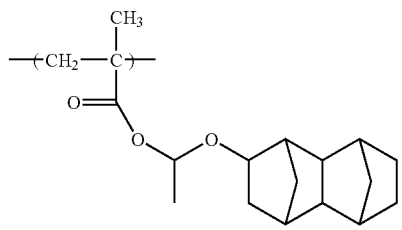
(a1-2-2) 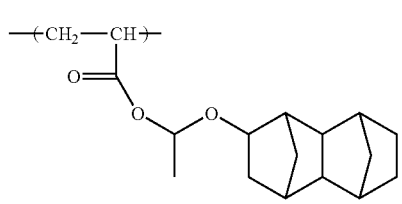
(a1-2-3) 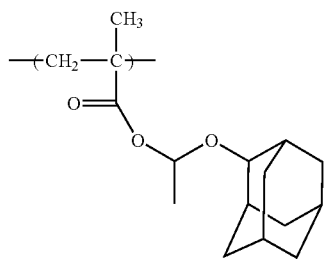
(a1-2-4) 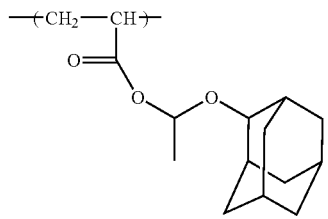
(a1-2-5) 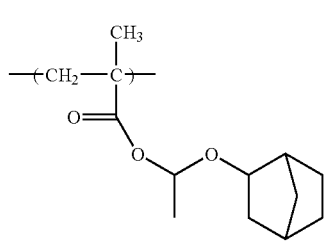
(a1-2-6) 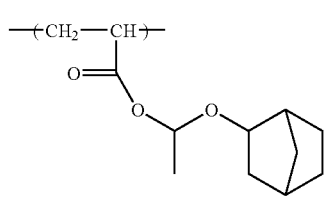
(a1-2-7) 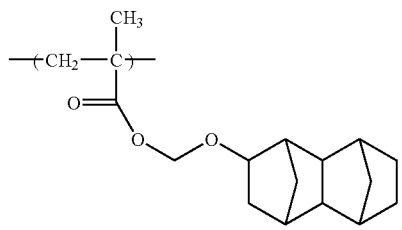

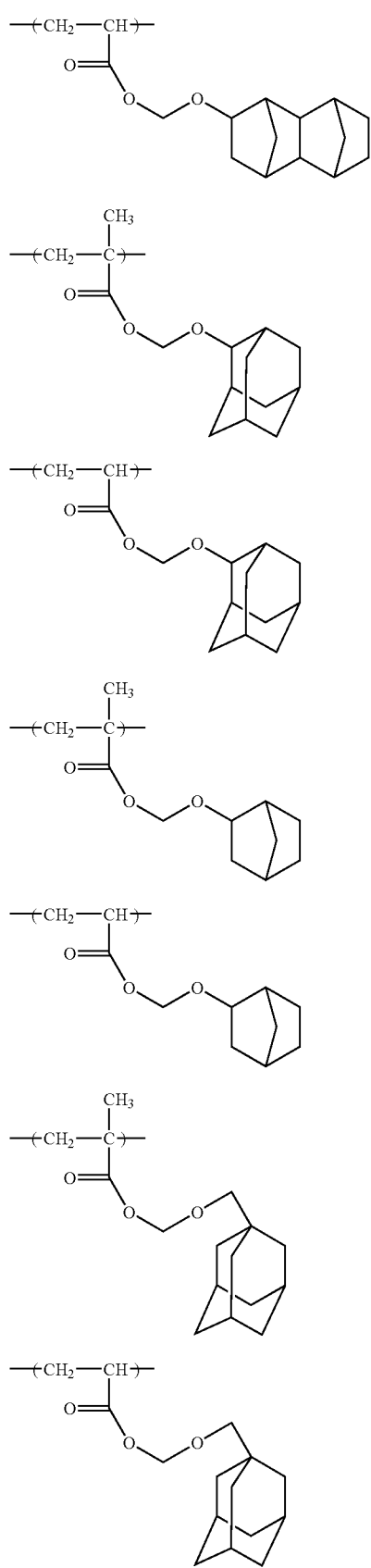
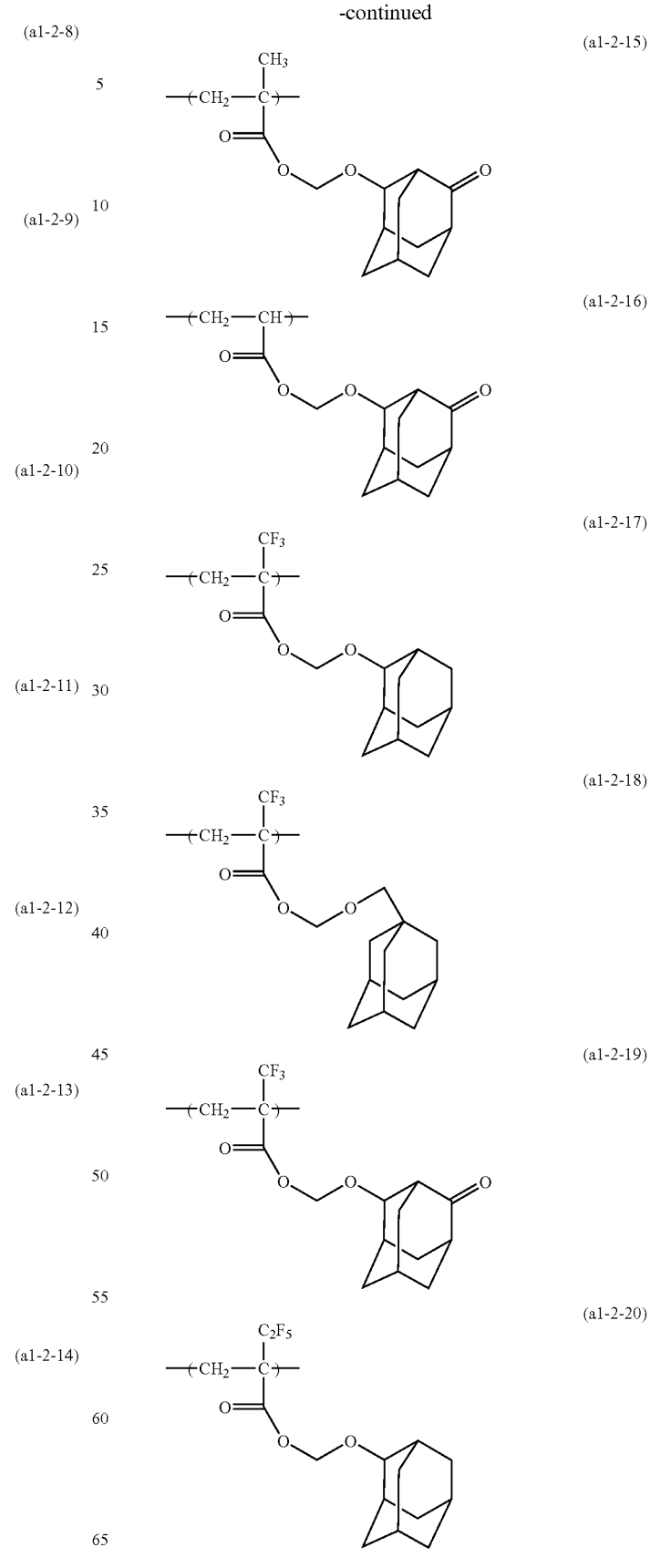

-continued
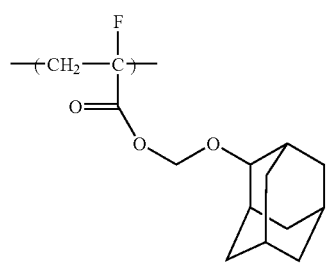 (a1-2-21)
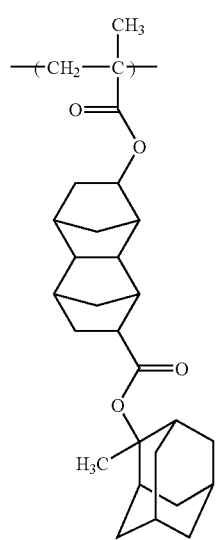 (a1-3-1)
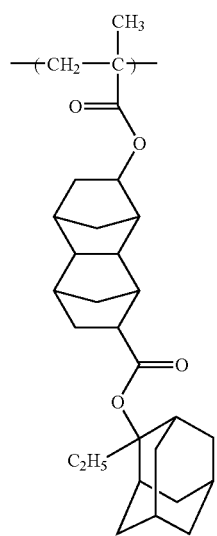 (a1-3-2)
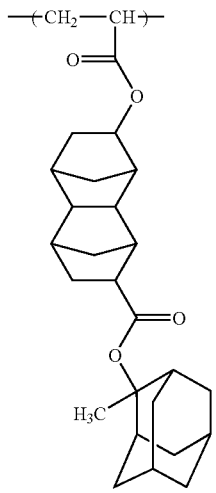 (a1-3-3)
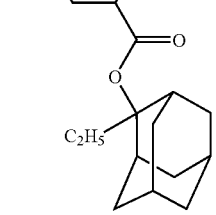 (a1-3-4)
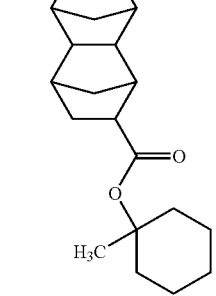 (a1-3-5)

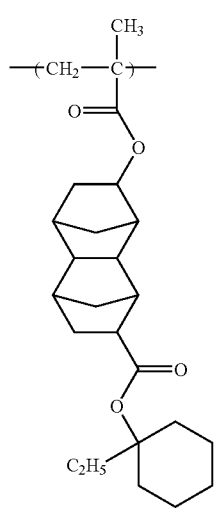 (a1-3-6)
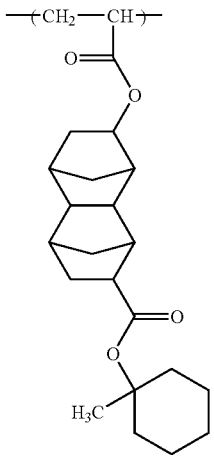 (a1-3-9)
(a1-3-7)
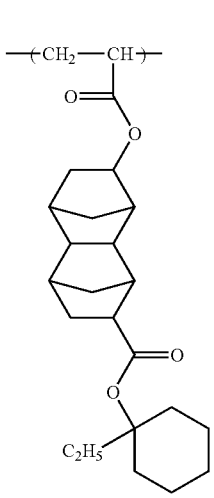 (a1-3-10)
(a1-3-8)
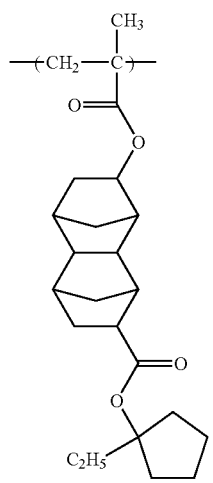
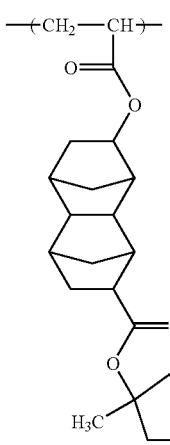 (a1-3-11)

-continued
(a1-3-12)
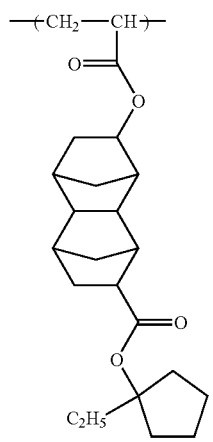
(a1-3-15)
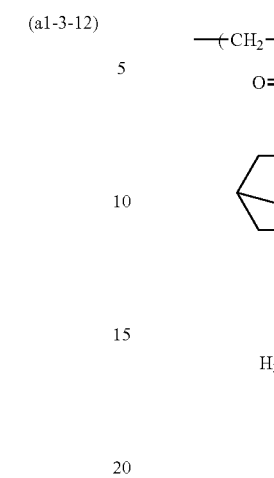
(a1-3-13)
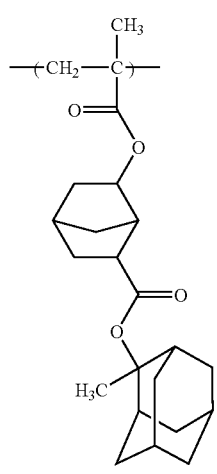
(a1-3-16)
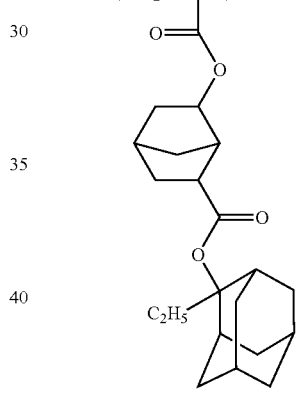
(a1-3-14)
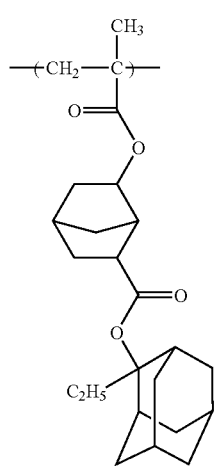
(a1-3-17)
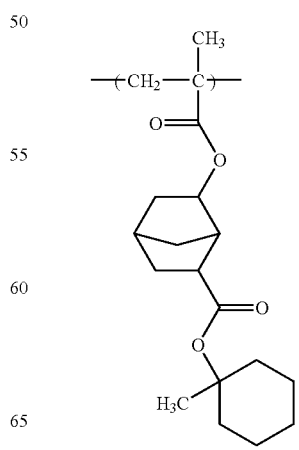

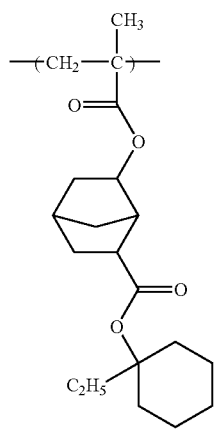 (a1-3-18)
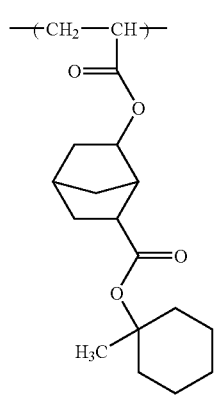 (a1-3-19)
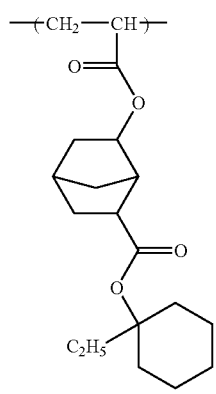 (a1-3-20)
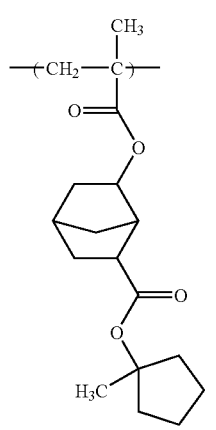 (a1-3-21)
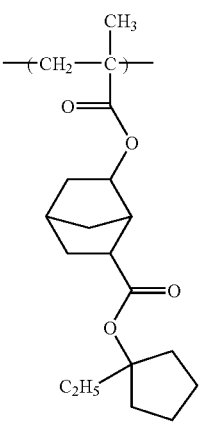 (a1-3-22)
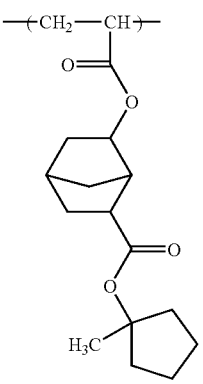 (a1-3-23)
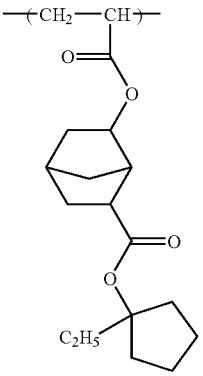 (a1-3-24)
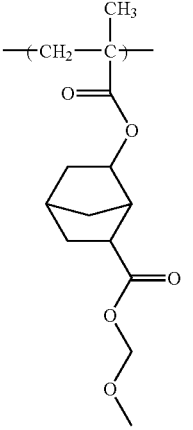 (a1-4-1)

-continued
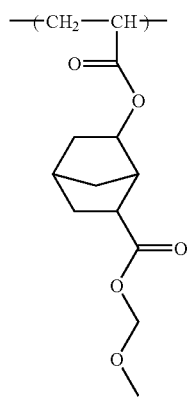
(a1-4-2)
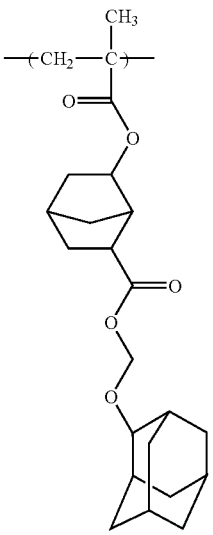
(a1-4-5)
(a1-4-3)
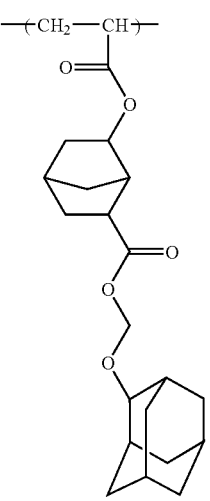
(a1-4-6)
(a1-4-4)
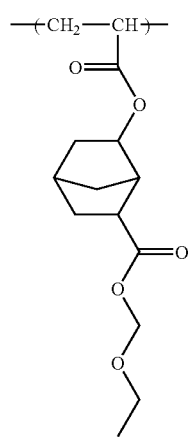
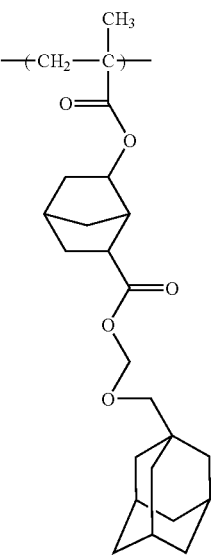
(a1-4-7)

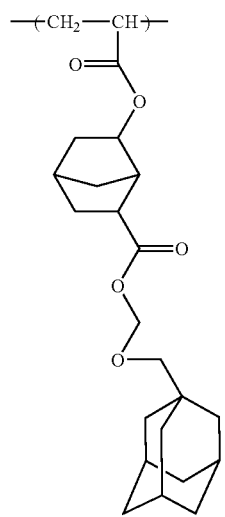
(a1-4-8)
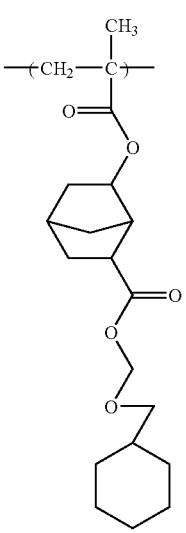
(a1-4-11)
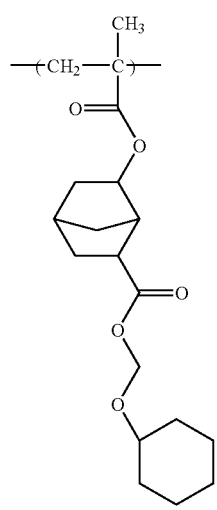
(a1-4-9)
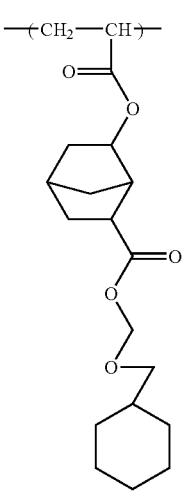
(a1-4-12)
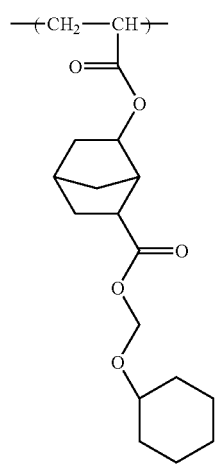
(a1-4-10)
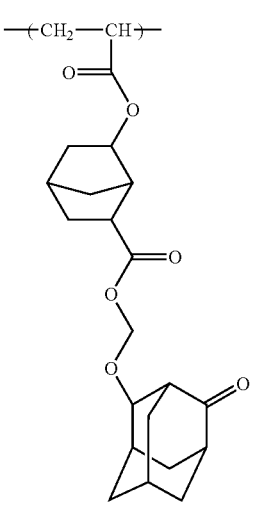
(a1-4-13)

(a1-4-14)
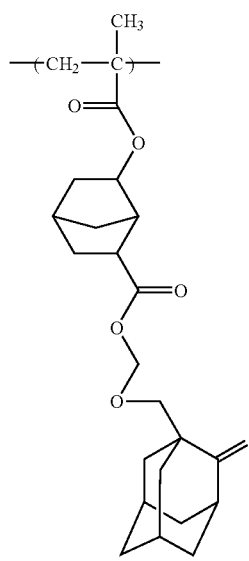
(a1-4-15)
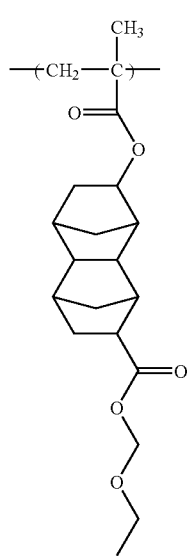
(a1-4-16)
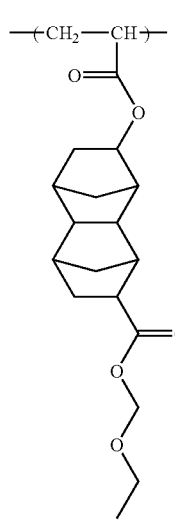
(a1-4-17)
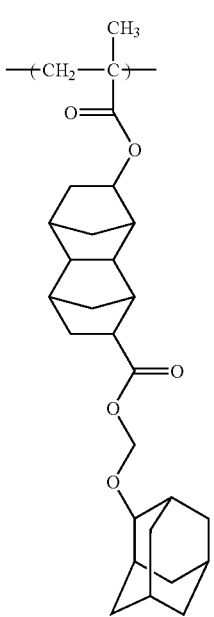
(a1-4-18)
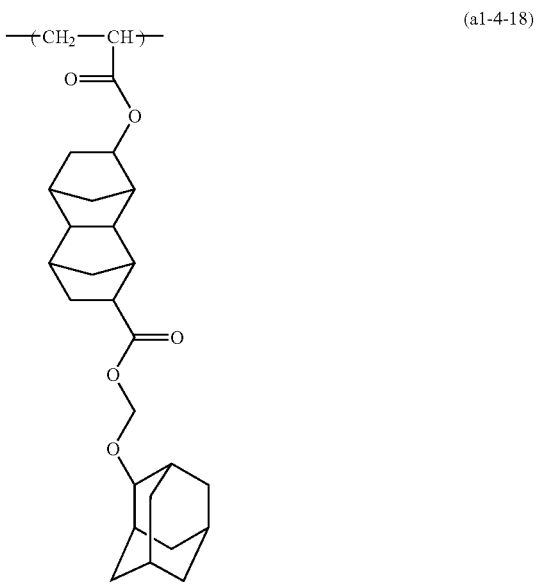

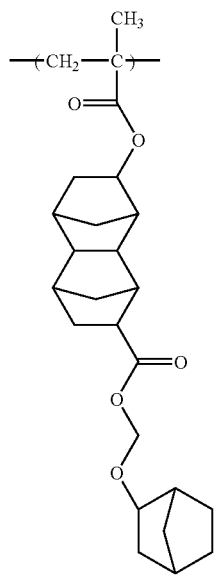
(a1-4-19)
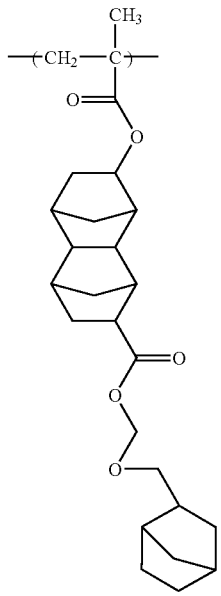
(a1-4-21)
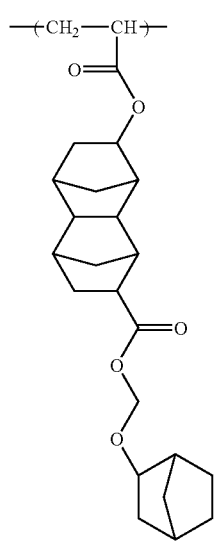
(a1-4-20)
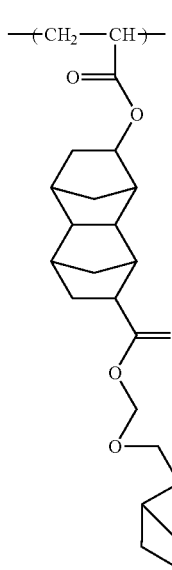
(a1-4-22)

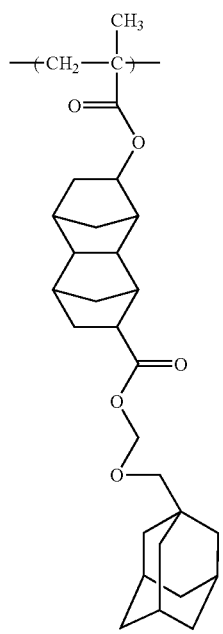 (a1-4-23)
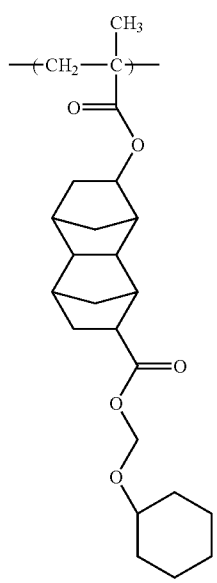 (a1-4-25)
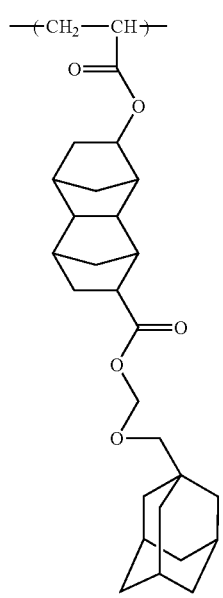 (a1-4-24)
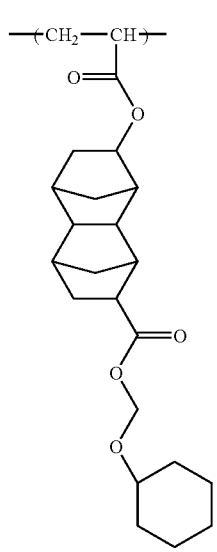 (a1-4-26)

-continued (a1-4-27)

(a1-4-29)

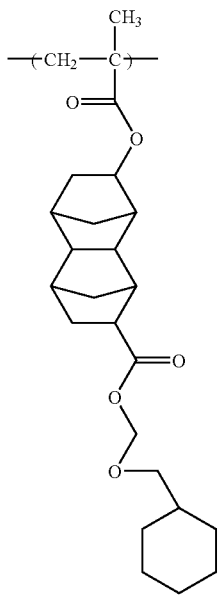

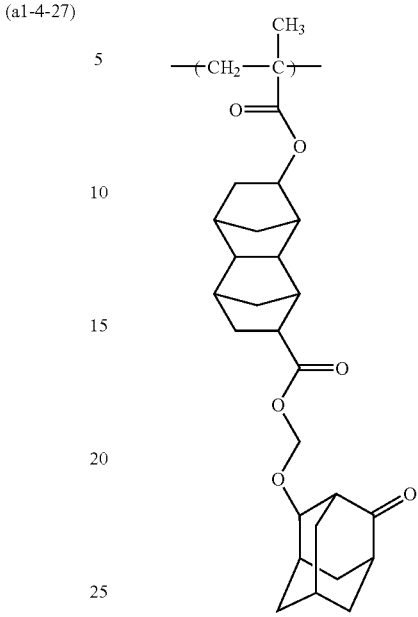

(a1-4-28)

(a1-4-30)

As the structural unit (a1), either a single type of structural unit may be used alone, or a combination of two or more different structural units may be used. Of the various possibilities, structural units represented by general formulas (a1-1) and (a1-3) are preferred and the structural units represented by general formula (a1-1) are more preferred. More specifically, the use of at least one structural unit selected from the structural units represented by general formulas (a1-1-1) to (a1-1-6) or (a1-1-35) to (a1-1-41) is the most preferred.

As the structural unit (a1), structural units represented by general formula (a1-1-01) including structural units represented by general formulas (a1-1-1) to (a1-1-4), and structural units represented by general formula (a1-1-02) including structural units represented by general formulas (a1-1-36), (a1-1-38), (a1-1-39) and (a1-1-41) are also preferred.

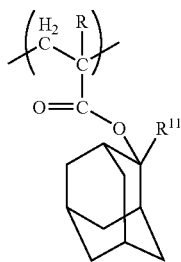

(a1-1-01)

(wherein R is as defined above, and $R^{11}$ represents a lower alkyl group.)

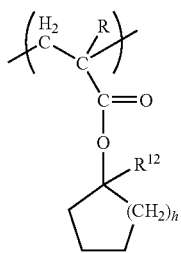

(a1-1-02)

(wherein R is as defined above, $R^{12}$ represents a lower alkyl group, and h represents an integer from 1 to 3)

In general formula (a1-1-01), R is as defined above. The lower alkyl group represented by $R^{11}$ is the same as that represented by R, although a methyl group or an ethyl group is preferable.

In the general formula (a1-1-02), R is as defined above. The lower alkyl group represented by $R^{12}$ is the same as that represented by R, although a methyl group or an ethyl group is preferable, and an ethyl group is most preferable. h is preferably either 1 or 2, and most preferably 2.

The structural unit (a1) is particularly preferably a structural unit of general formula (a1-1-01) in which R is a methyl group. A structural unit of general formula in which $R^{11}$ is an ethyl group is also preferred. A structural unit of general formula in which R is a methyl group and $R^{11}$ is an ethyl group is particularly preferred.

The proportion of the structural unit (a1) in the component (A), relative to the combined total of all the structural units that constitute the component (A), is preferably within a range from 10 to 80 mol %, more preferably from 20 to 70 mol %, and most preferably from 30 to 50 mol %. Ensuring that this proportion is at least as large as the lower limit of the above range enables a pattern to be obtained when the component (A) is used in a resist composition, whereas ensuring that the proportion is no greater than the upper limit enables a balance to be achieved with the other structural units.

—Structural Unit (a2)

The resin component (A) preferably contains, in addition to the structural unit (a1), a structural unit (a2) derived from an acrylate ester that contains a lactone-containing monocyclic or polycyclic group.

When the resin component (A) is used to form a resist film, the use of the lactone-containing monocyclic or polycyclic group of the structural unit (a2) is effective in improving the adhesion between the resist film and the substrate, and in enhancing the hydrophilicity relative to the developing solution.

Here, the term "lactone-containing monocyclic or polycyclic group" refers to a cyclic group containing a single ring (lactone ring) containing a —O—C(O)— structure, and this ring is counted as the first ring. Accordingly, the case in which the only ring structure is the lactone ring is referred to as a monocyclic group, and groups containing other ring structures are described as polycyclic groups regardless of the structure of the other rings.

There are no particular restrictions on the structural unit (a2), and any unit that includes both this type of lactone structure (—O—C(O)—) and a cyclic group can be used.

Specific examples of lactone-containing monocyclic groups include groups in which one hydrogen atom has been removed from γ-butyrolactone. Furthermore, examples of lactone-containing polycyclic groups include groups in which one hydrogen atom has been removed from a lactone ring-containing bicycloalkane, tricycloalkane or tetracycloalkane. Groups in which one hydrogen atom has been removed from a lactone-containing tricycloalkane with the type of structural formula shown below are preferred for reasons such as industrial availability.

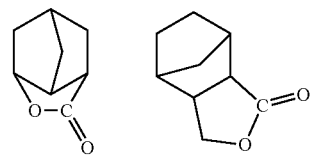

More specific examples of the structural unit (a2) include the structural units represented by general formulas (a2-1) to (a2-5) shown below.

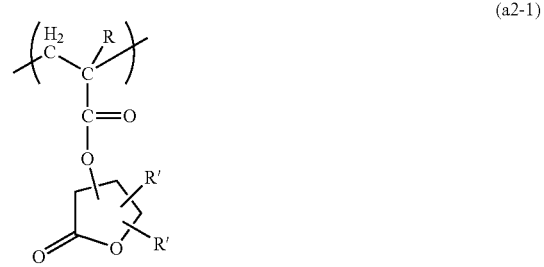

(a2-1)

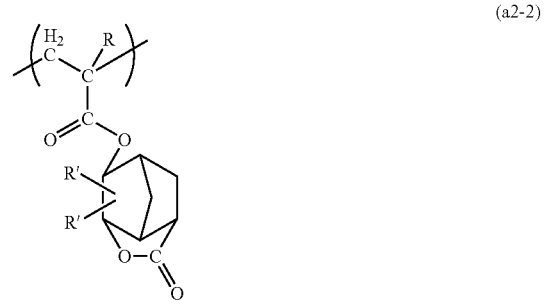

(a2-2)

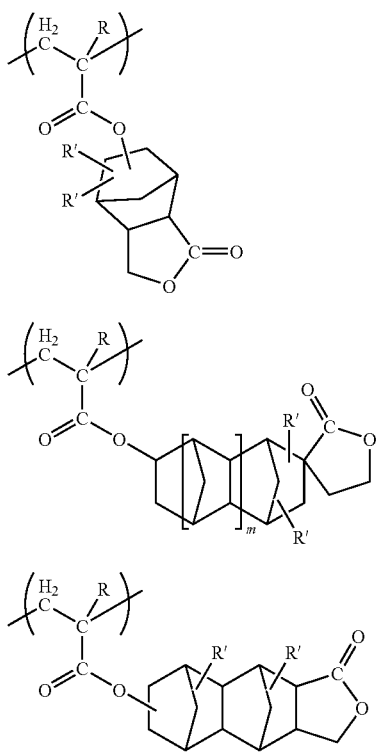

(a2-3)

(a2-4)

(a2-5)

(wherein R is as defined above, R' represents a hydrogen atom, a lower alkyl group, or an alkoxy group of 1 to 5 carbon atoms, and m represents an integer of either 0 or 1.)

For the lower alkyl groups of R' in general formulas (a2-1) to (a2-5), the same description applies as that used for the lower alkyl group of R in the above structural unit (a1).

In general formulas (a2-1) to (a2-5), from the viewpoints of factors such as industrial availability, R' is preferably a hydrogen atom.

Specific structural units of general formulas (a2-1) to (a2-5) are shown below.

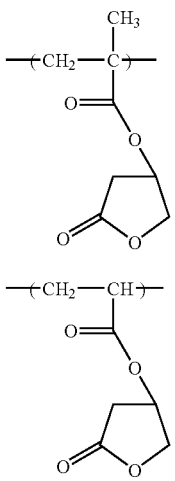

(a2-1-1)

(a2-1-2)

(a2-1-3)

(a2-1-4)

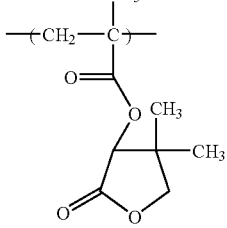

(a2-1-5)

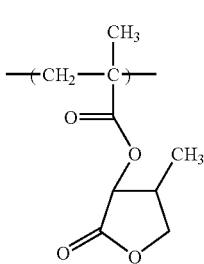

(a2-1-6)

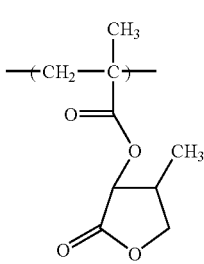

(a2-2-1)

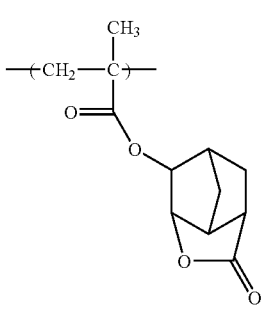

(a2-2-2)

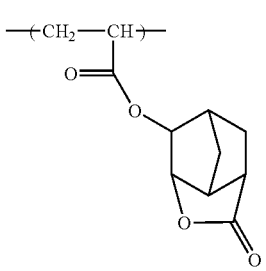

(a2-2-3)
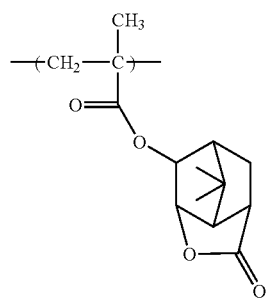
(a2-2-4)
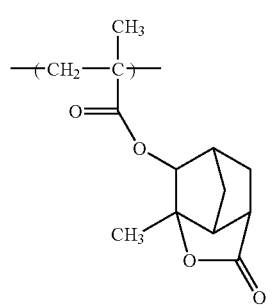
(a2-2-5)
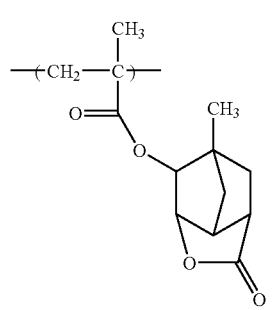
(a2-3-1)
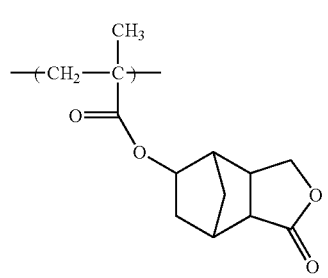
(a2-3-2)
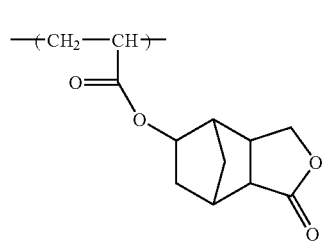
(a2-3-3)
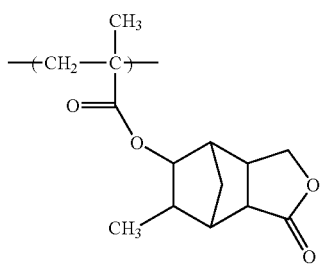
(a2-3-4)
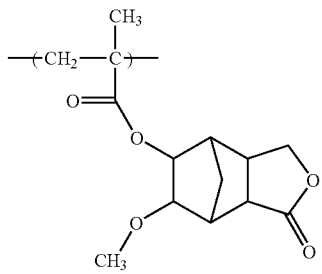
(a2-3-5)
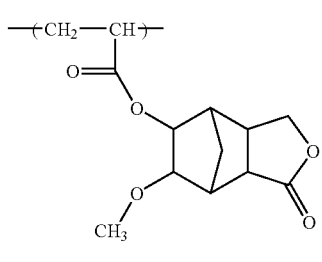
(a2-3-6)
(a2-3-7)
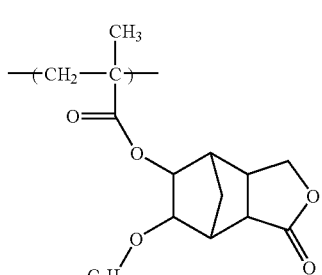
(a2-3-8)
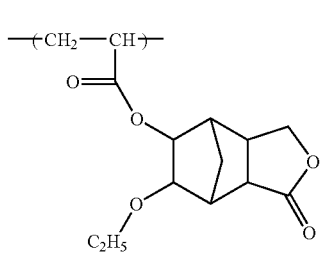

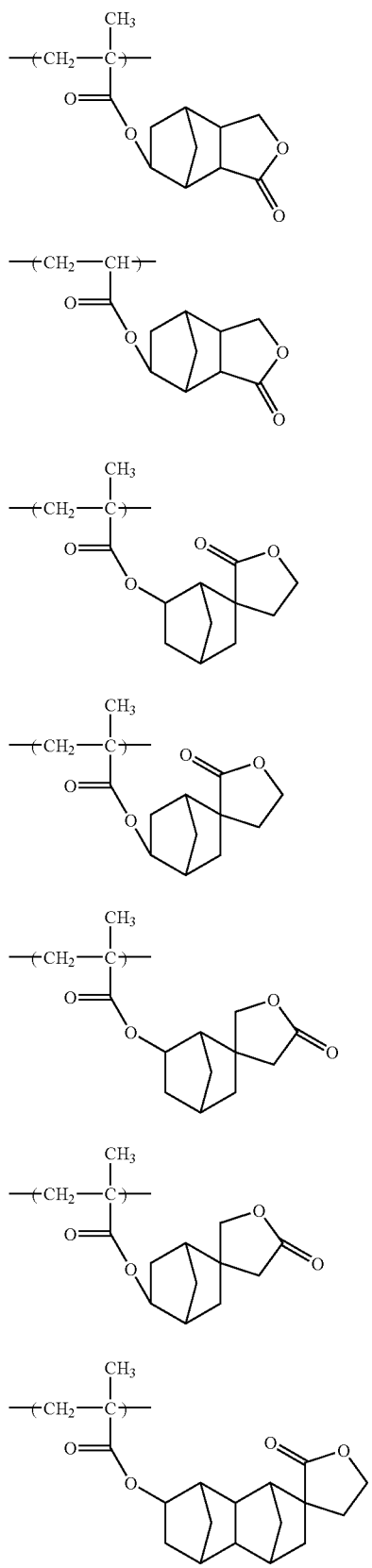
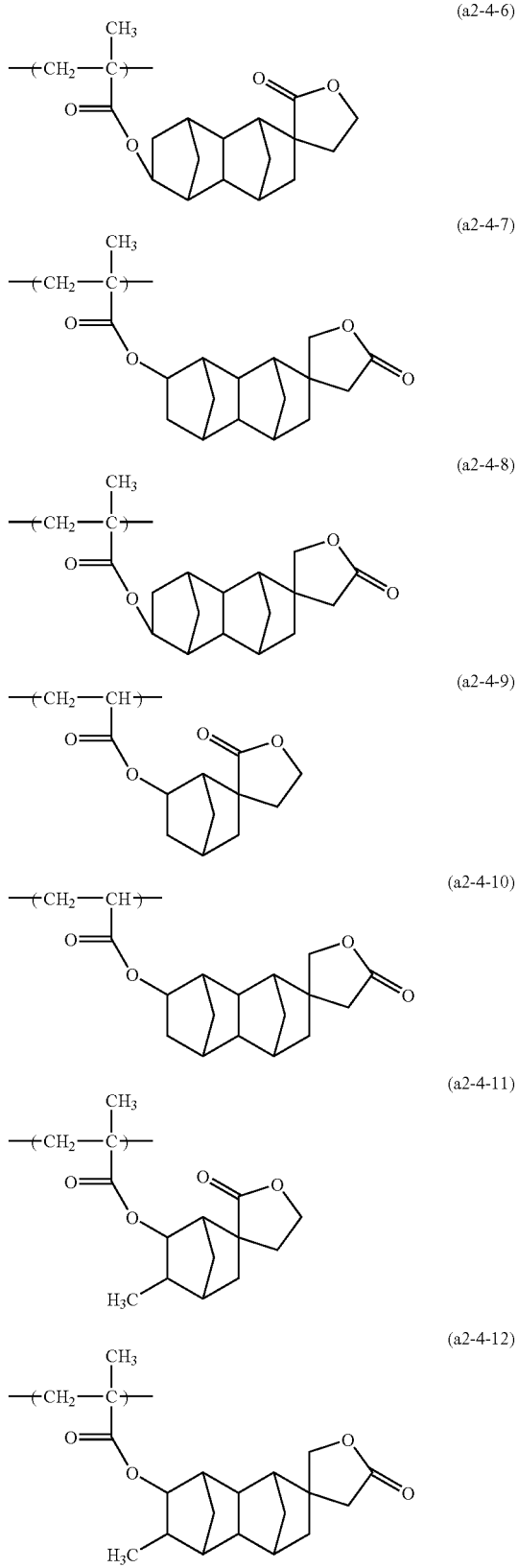

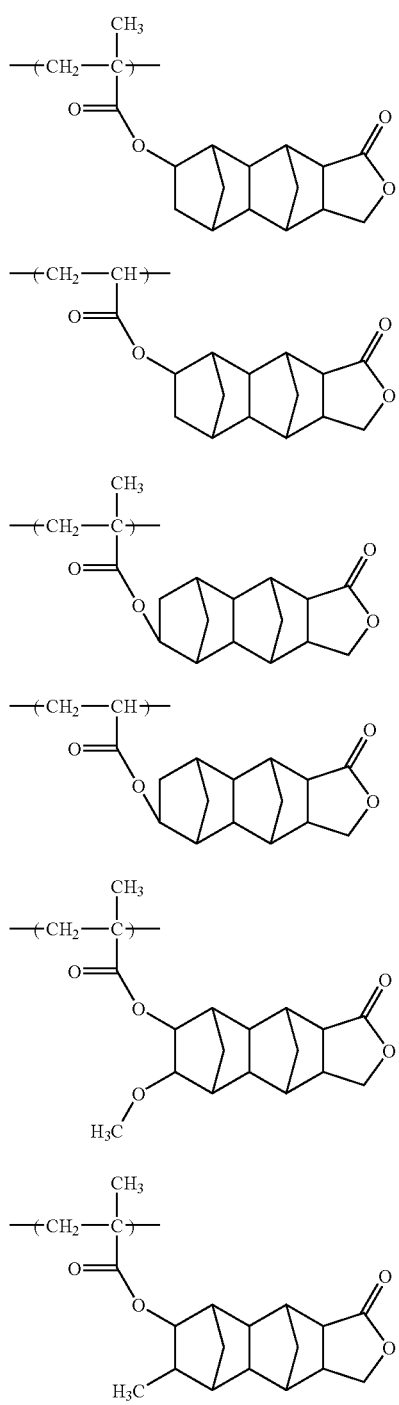

Of these structural units, at least one structural unit selected from structural units of general formulas (a2-1) to (a2-5) is preferred and the use of at least one structural unit selected from structural units of general formulas (a2-1) and (a2-3) is preferred. Specifically, the use of at least one structural unit selected from structural units of chemical formulas (a2-1-1), (a2-1-2), (a2-2-1), (a2-2-2), (a2-3-1), (a2-3-2), (a2-3-9) and (a2-3-10) is preferred, and a structural unit of chemical formula (a2-3-1) is preferred.

As the structural unit (a2), either a single type of structural unit may be used alone, or a combination of two or more different structural units may be used in the resin component (A).

The proportion of the structural unit (a2) in the component (A), relative to the combined total of all the structural units that constitute the component (A), is preferably within a range from 5 to 60 mol %, more preferably from 15 to 50 mol %, and most preferably from 25 to 50 mol %. Ensuring that this proportion is at least as large as the lower limit of the above range enables the effects obtained by including the structural unit (a2) to be satisfactorily realized, whereas ensuring that the proportion is no greater than the upper limit enables a balance to be achieved with the other structural units.

In the present invention, the resin component (A) is preferably a copolymer containing both of these structural units (a1) and (a2) in terms of achieving excellent effects for the present invention.

—Structural Unit (a3)

The resin component (A) may contain, in addition to the structural unit (a1), or the structural units (a1) and (a2), a structural unit (a3) derived from an acrylate ester that contains a polar group-containing aliphatic hydrocarbon group. Including the structural unit (a3) enhances the hydrophilicity of the resin component (A), thereby improving the affinity with the developing solution, improving the alkali solubility within the exposed portions, and contributing to an improvement in the resolution.

Examples of the polar group include a hydroxyl group, a cyano group, a carboxyl group, or a hydroxyalkyl group in which a portion of the hydrogen atoms of the alkyl group is substituted with fluorine atoms, although a hydroxyl group is particularly preferred.

Examples of the aliphatic hydrocarbon group include straight chain or branched chain hydrocarbon groups (preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers.

Of the various possibilities, structural units that contain a hydroxyl group, a cyano group, a carboxyl group, or a hydroxyalkyl group in which a portion of the hydrogen atoms of the alkyl group is substituted with fluorine atoms, and are also derived from an acrylate ester are particularly preferred. Examples of suitable polycyclic groups include groups in which one or more hydrogen atoms have been removed from a bicycloalkane, tricycloalkane or tetracycloalkane. Specific examples include groups in which one or more hydrogen atoms have been removed from a polycycloalkane such as adamantane, norbornane, isobornane, tricyclodecane or tetracyclododecane. These types of polycyclic groups can be selected appropriately from the multitude of groups proposed for the polymer (resin component) of resist compositions designed for use with ArF excimer lasers. Of these polycyclic groups, a group in which two or more hydrogen atoms have been removed from adamantane, a group in which two or more hydrogen atoms have been removed from norbornane, or a group in which two or more hydrogen atoms have been removed from tetracyclododecane is preferred industrially.

When the hydrocarbon group in the polar group-containing aliphatic hydrocarbon group is a straight chain or branched chain hydrocarbon group of 1 to 10 carbon atoms, the structural unit (a3) is preferably a structural unit derived from the hydroxyethyl ester of acrylic acid, whereas when the hydrocarbon group is a polycyclic group, structural units represented by formulas (a3-1), (a3-2) and (a3-3) shown below are preferred.

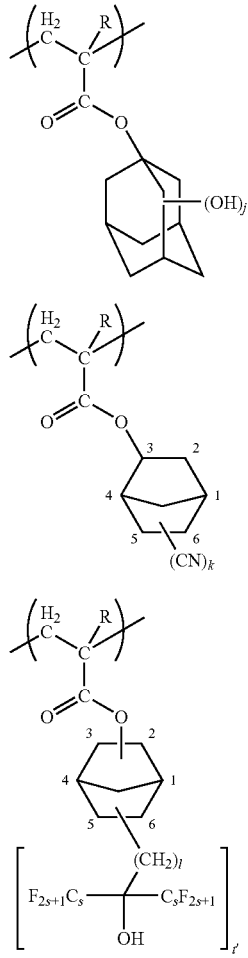

(a3-1)

(a3-2)

(a3-3)

(wherein R is as defined above, j represents an integer from 1 to 3, k represents an integer from 1 to 3, t' represents an integer from 1 to 3, l represents an integer from 1 to 5, and s represents an integer from 1 to 3.)

In the formula (a3-1), the value of j is preferably 1 or 2, and more preferably 1. When the value of j is 2, structural units in which the hydroxyl group is bonded to position 3 and position 5 of the adamantyl group are preferred. When the value of j is 1, structural units in which the hydroxyl group is bonded to position 3 of the adamantyl group are preferred.

In the formula (a3-2), the value of k is preferably 1, and structural units in which the cyano group is bonded to either position 5 or position 6 of the adamantyl group are preferred.

In the formula (a3-3), the value of t' is preferably 1. The value of l is preferably 1 and the value of s is preferably 1. Structural units in which a 2-norbornyl group or a 3-norbornyl group is bonded to the terminal of the carboxyl group of acrylic acid are preferred. Structural units in which a fluorinated alkyl alcohol is bonded to either position 5 or position 6 of the norbornyl group are preferred.

Of these structural units, structural units in which the value of j is 1 and the hydroxyl group is bonded to position 3 of the adamantyl group in formula (a3-1) are particularly preferred.

As the structural unit (a3), either a single type of structural unit may be used alone, or a combination of two or more different structural units may be used.

The proportion of the structural unit (a3) in the polymer component (A), relative to the combined total of all the structural units that constitute the component (A), is preferably within a range from 5 to 50 mol %, more preferably from 15 to 45 mol %, and most preferably from 15 to 35 mol %.

—Structural Unit (a4)

The resin component (A) may also include another structural unit (a4) besides the structural units (a1) to (a3), provided the inclusion of this other unit does not impair the effects of the present invention.

As the structural unit (a4), any other structural unit that cannot be classified as one of the above structural units (a1) through (a3) can be used without any particular restrictions, and any of the multitude of conventional structural units used in resist resins for ArF excimer lasers or KrF excimer lasers (and particularly for ArF excimer lasers) can be used.

As the structural unit (a4), a structural unit that contains a non-acid-dissociable aliphatic polycyclic group, and is also derived from an acrylate ester is preferred. Examples of this polycyclic group include the same groups as those described above in relation to the aforementioned structural unit (a1), and any of the multitude of conventional polycyclic groups used in the resin component of resist compositions for ArF excimer lasers or KrF excimer lasers (and particularly for ArF excimer lasers) can be used.

In particular, at least one group selected from a tricyclodecanyl group, an adamantyl group, a tetracyclododecanyl group, an isobornyl group, and a norbornyl group is preferred in terms of factors such as industrial availability. These polycyclic groups may also be substituted with a straight chain or branched chain alkyl group of 1 to 5 carbon atoms.

Specific examples of the structural unit (a4) include structures of general formulas (a4-1) to (a4-5) shown below.

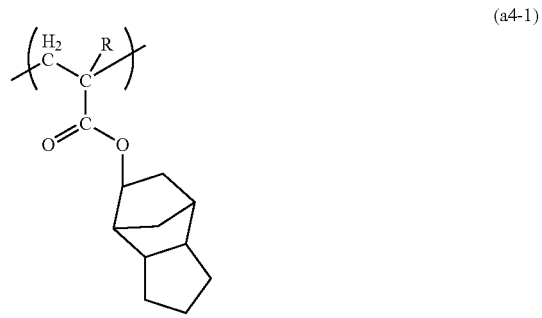

(a4-1)

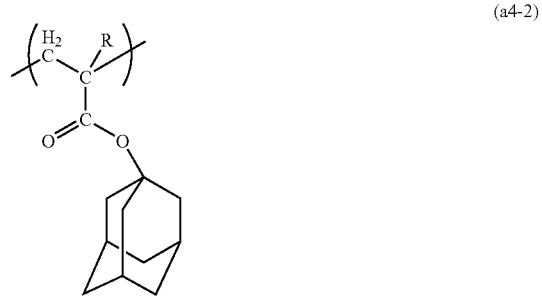

(a4-2)

-continued

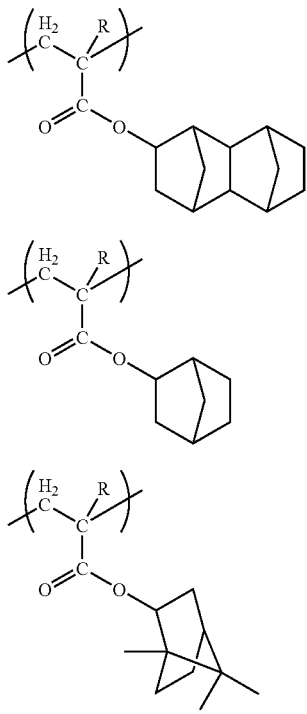

(a4-3)

(a4-4)

(a4-5)

(wherein R is as defined above)

Although the structural unit (a4) is not an essential component of the component (A), if included in the component (A), the proportion of the structural unit (a4), relative to the combined total of all the structural units that constitute the component (A), is typically within a range from 1 to 30 mol %, and preferably from 10 to 20 mol %.

The component (A) can be obtained, for example, by a conventional radical polymerization or the like of the monomers that give rise to each of the structural units, using a radical polymerization initiator such as azobisisobutyronitrile (AIBN).

Structural Unit (M1) having Specific Terminal Structure

It is preferred that the resin component (A) contains a hydroxyl group bonded to the carbon atoms at the polymer terminal and the carbon atoms at the α-position of the hydroxyl group has a terminal structure that contains at least one electron withdrawing group.

Examples of the electron withdrawing group include a halogen atom and a halogenated alkyl group.

Examples of the halogen atom include a fluorine atom and a chlorine atom, although a fluorine atom is preferred.

In the halogenated alkyl group, the halogen is the same as that in the case of the halogen atom. The alkyl group is preferably a lower alkyl group of about 1 to 3 carbon atoms, more preferably a methyl group or an ethyl group, and most preferably a methyl group. Specific examples include a trifluoromethyl group, a difluoromethyl group, a monofluoromethyl group, and a perfluoroethyl group, although a trifluoromethyl group is preferred.

The number of electron withdrawing groups is either 1 or 2, and preferably 2.

Including a hydroxyl group bonded to the carbon atoms at the polymer terminal, the carbon atoms at the α-position of the hydroxyl group having a terminal structure that contains at least one electron withdrawing group, describes more specifically and preferably containing a —C $R^1$ $R^2$OH group, wherein $R^1$ and $R^2$ each represents, independently, an alkyl group, a halogen atom, or a halogenated alkyl group, at least one of which is an electron withdrawing group selected from a halogen atom and a halogenated alkyl group.

Herein, the halogen atom and the halogenated alkyl group are the same as those shown above and examples of the alkyl group include lower alkyl groups of 1 to 3 carbon atoms, such as a methyl group, an ethyl group, and a propyl group As described above, the electron withdrawing group is preferably a fluorine atom or a fluorinated alkyl group. It is preferred that both $R^1$ and $R^2$ are fluorinated alkyl groups, particularly trifluoromethyl groups in terms of synthesis and achieving excellent effects of decreasing LER (line edge roughness: heterogeneous irregularity of line side wall).

The proportion of the structural unit (M1) that contains a —$CR^1R^2$OH group bonded to the polymer terminal (hereinafter, the group is sometimes referred to as a "terminal structure") in the component (A), relative to 100 mol % of the combined total of all the structural units that constitute the component (A), except for the structural unit (M1), is preferably 1 mol % or more (preferably 2 mol % or more). The combined total of all the structural units, except for the structural unit (M1), includes structural units derived from a well-known radical polymerization initiator such as azobisisobutyronitrile (AIBN) used in radical polymerization, and units derived from a monomer as a main component of the resin.

There are no particular restrictions on the upper limit, although the upper limit is, for example, 5 mol % or less in view of the production method. Ensuring that the proportion is no less than 1 mol % enables excellent effects of reducing developing defects and improving LER to be achieved by introducing the terminal structure, whereas there is a tendency for the effects to lower if the proportion is no greater than the above value. Of course, the number of mols of the structural unit (M1) is equal to the number of mols of the terminal structure and that of the hydroxyl group.

The terminal structure can be introduced into the terminal of the polymer by adding a chain transfer agent that contains a —$CR^1R^2$OH group when the polymer is produced by radical polymerization using a monomer and a polymerization initiator. In this case, the structural unit (M1) having the terminal structure is a structural unit (M1) derived from the chain transfer agent.

The chain transfer agent is represented, for example, by general formula "X—$R^{61}$—$CR^1R^2$OH".

In the formula, X is a hydroxyl group or a thiol group and the chain transfer agent is bonded to the terminal of the polymer as a result of the elimination of hydrogen atoms of a hydroxyl group or thiol group. Therefore, in this case, the structural unit (M1) is a unit in which hydrogen atoms have been removed from the hydroxyl group or thiol group represented by X in "X—$R^{61}$—$CR^1R^2$OH". In view of reactivity, X is preferably a thiol group.

$R^{61}$ in "X—$R^{61}$—$CR^1R^2$OH" is a divalent aliphatic hydrocarbon group (may be either a straight chain, branched chain, or cyclic) or a divalent aromatic hydrocarbon group. Of these groups, a straight chain or branched chain aliphatic hydrocarbon group is preferable.

Examples of the alicyclic group include a cyclohexylene group. Examples of the aromatic hydrocarbon group include a p-phenylene group.

Examples of the straight chain or branched chain aliphatic hydrocarbon group include a methylene group, an ethylene group, an n-propylene group, and an isopropylene group, although an ethylene group and an n-propylene group are preferable.

Preferable chain transfer agents are represented by general formula SH—$(CH_2)_{m'}$—$C(CF_3)_2$—OH (m' is an integer from 2 to 4). Consequently, preferable structural units (M1) are represented by —S—$(CH_2)_{m'}$—$C(CF_3)_2$—OH.

The proportion of the terminal structure (proportion of the structural unit (M1)) can vary by adjusting the weight average molecular weight of a resin for the resist composition through adjustment of the amount of a monomer to be charged, the amount of the chain transfer agent or timing for the addition of the chain transfer agent.

In the resin for the resist composition after the synthesis, the number of moles of the terminal structure (the number of moles of the structural unit (M1)) can be measured, for example, by NMR (nuclear magnetic resonance spectrum) such as proton-NMR or carbon NMR.

There are no particular restrictions on the weight average molecular weight (Mw) (the polystyrene equivalent weight average molecular weight determined by gel permeation chromatography) of the component (A), and the weight average molecular weight is preferably within a range from 2,000 to 50,000, more preferably from 3,000 to 30,000, and most preferably from 5,000 to 20,000. Ensuring that the weight average molecular weight is smaller than the upper limit of the above range enables sufficient solubility in a resist solvent, which is suited for use as a resist, whereas ensuring that the weight average molecular weight is greater than the lower limit of the above range enables excellent dry etching resistance and resist pattern profile.

The dispersion degree (Mw/Mn) is preferably from 1.0 to 5.0, more preferably from 1.0 to 3.0, and most preferably from 1.2 to 2.5. Mn is the number average molecular weight.

Acid Generator Component (B)

The acid generator component (B) contains an acid generator (B1) represented by general formula (B1). [hereinafter referred sometimes to as a component (B1)]. The effects of the present invention are improved by including the component (B1).

In general formula (B1), $R^{51}$ represents a straight chain, branched chain, or cyclic alkyl group, or a straight chain, branched chain, or cyclic fluorinated alkyl group.

The straight chain or branched chain alkyl group is preferably a straight chain or branched chain alkyl group of 1 to 10 carbon atoms, more preferably 1 to 8 carbon atoms, and most preferably 1 to 4 carbon atoms.

The cyclic alkyl group is preferably a cyclic alkyl group of 4 to 12 carbon atoms, more preferably 5 to 10 carbon atoms, and most preferably 6 to 10 carbon atoms.

The fluorinated alkyl group is preferably a fluorinated alkyl group of 1 to 10 carbon atoms, more preferably 1 to 8 carbon atoms, and most preferably 1 to 4 carbon atoms. The fluorination ratio of the fluorinated alkyl group (the proportion of fluorine atoms, with which hydrogen atoms are substituted, relative to the total number of hydrogen atoms in the alkyl group) is preferably from 10 to 100%, more preferably from 50 to 100%, and groups in which all of the hydrogen atoms have been substituted with fluorine atoms yield the strongest acids, and are consequently the most preferred.

$R^{51}$ is most preferably a straight chain alkyl group or fluorinated alkyl group.

$R^{52}$ is a hydrogen atom, a hydroxyl group, a halogen atom, a straight chain, branched chain, or cyclic alkyl group, a straight chain or branched chain halogenated alkyl group, or a straight chain or branched chain alkoxy group.

In $R^{52}$, examples of the halogen atom include a fluorine atom, a bromine atom, a chlorine atom, and an iodine atom, of which a fluorine atom is preferable.

In $R^{52}$, the alkyl group is a straight chain or branched chain and is preferably a group of 1 to 5 carbon atoms, particularly 1 to 4 carbon atoms, and more preferably 1 to 3 carbon atoms. In $R^{52}$, the cyclic alkyl group is a cyclic alkyl group of preferably 4 to 12 carbon atoms, and particularly preferably 5 to 10.

In $R^{52}$, the halogenated alkyl group is a group in which either a portion of, or all of, the hydrogen atoms in the alkyl group are substituted with a halogen atom. Herein, the alkyl group includes the same "alkyl group" represented by $R^{52}$. The halogen atom to be substituted includes the same groups as those described for the above "halogen atom". In the halogenated alkyl group, 50 to 100% of all the hydrogen atoms are preferably substituted with the halogen atom and, more preferably, all the hydrogen atoms are substituted.

In $R^{52}$, the alkoxy group is a straight chain or branched chain alkoxy group and is preferably a group of 1 to 5 carbon atoms, particularly 1 to 4 carbon atoms, and more preferably 1 to 3 carbon atoms.

$R^{52}$ is preferably a hydrogen atom.

$R^{53}$ is an aryl group which may include a substituent and examples of the aryl group having a basic ring structure in which the substituent has been removed include those of 6 to 14 carbon atoms, such as a naphthyl group, a phenyl group, or an anthracenyl group. In view of the effects of the present invention and absorption of exposure light such as an ArF excimer laser, a phenyl group is preferable.

Examples of the substituent include a hydroxyl group or a lower alkyl group (straight chain or branched chain and is preferably of no greater than 5 carbon atoms, and is particularly preferably a methyl group).

The aryl group represented by $R^{53}$ preferably includes no substituent.

n is an integer from 1 to 3, preferably 2 or 3, and particularly preferably 3.

Preferred examples of the acid generator (B1) include the following.

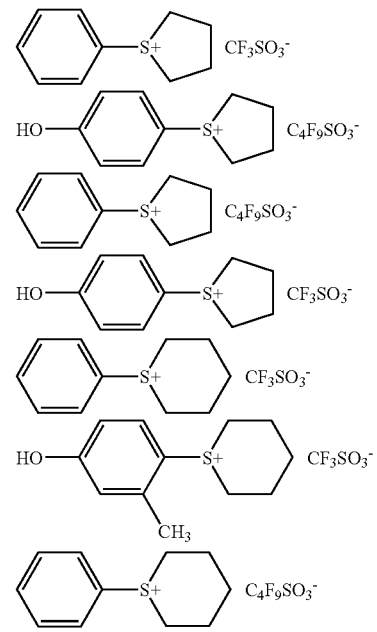

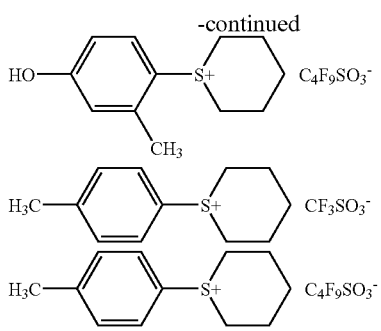

Of these acid generators, a compound represented by chemical formula (b-0-1) is preferable.

The content of the component (B1) in the component (B) is preferably 5% by mass or less, more preferably from 5 to 90% by mass, particularly preferably from 10 to 85% by mass, and most preferably from 15 to 80% by mass.

These components (B1) can be used either alone, or in combinations of two or more different compounds.

It is preferred to include an acid generator (B2) besides the component (B1) because excellent sensitivity is ensured. The acid generator (B2) is preferably an onium salt. The acid generator (B2) preferably contains an onium salt (hereinafter, an onium salt as the acid generator (B2) is referred to as an onium salt (B2-0), or a component (B2-0)) because particularly excellent sensitivity is ensured.

There are no particular restrictions on the component (B2-0), provided it does not overlap with the component (B1), and it is possible to use optional onium salt acid generators that have conventionally been proposed as an acid generator for chemically amplified photoresists. As the onium salt (B2-0), a multitude of onium salts such as iodonium salts and sulfonium salts have conventionally been known.

In the present invention, the component (B) preferably contain, as the onium salt (B2-0), at least one either of onium salts (B2-1) and (B2-2) shown below.

Examples of onium salt (B2-1) include compounds represented by general formulas (b-1) and (b-2) shown below

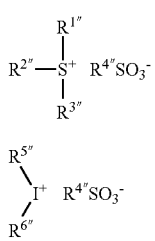

(wherein $R^{1''}$ to $R^{3''}$, and $R^{5''}$ and $R^{6''}$ each represents, independently, an aryl group or an alkyl group; and $R^{4''}$ represents a straight chain, branched chain, or cyclic alkyl group or fluorinated alkyl group; provided that at least one of $R^{1''}$ to $R^{3''}$ represents an aryl group, and at least one of $R^{5''}$ and $R^{6''}$ represents an aryl group.)

In the formula (b-1), $R^{1''}$ to $R^{3''}$ each represents, independently, an aryl group or an alkyl group. Of the groups $R^{1''}$ to $R^{3''}$, at least one group represents an aryl group. Compounds in which at least two of $R^{1''}$ to $R^{3''}$ represent aryl groups are preferred, and compounds in which all of $R^{1''}$ to $R^{3''}$ are aryl groups are the most preferred.

There are no particular restrictions on the aryl groups of $R^{1''}$ to $R^{3''}$, and suitable examples include aryl groups of 6 to 20 carbon atoms, in which either a portion of, or all of, the hydrogen atoms of these aryl groups may be substituted with alkyl groups, alkoxy groups, or halogen atoms and the like. In terms of enabling low-cost synthesis, aryl groups of 6 to 10 carbon atoms are preferred. Specific examples of suitable groups include a phenyl group and a naphthyl group.

Alkyl groups that may be used for substitution of the hydrogen atoms of the above aryl groups are preferably alkyl groups of 1 to 5 carbon atoms, and a methyl group, an ethyl group, a propyl group, an n-butyl group or a tert-butyl group is the most preferred.

Alkoxy groups that may be used for substitution of the hydrogen atoms of the above aryl groups are preferably alkoxy groups of 1 to 5 carbon atoms, and a methoxy group or an ethoxy group is the most preferred. Halogen atoms that may be used for substitution of the hydrogen atoms of the above aryl groups are preferably fluorine atoms.

There are no particular restrictions on the alkyl groups of $R^{1''}$ to $R^{3''}$, and suitable examples include straight chain, branched chain, or cyclic alkyl groups of 1 to 10 carbon atoms. From the viewpoint of achieving excellent resolution, alkyl groups of 1 to 5 carbon atoms are preferred. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, although in terms of achieving excellent resolution and enabling low-cost synthesis, a methyl group is the most preferred.

Of the above possibilities, compounds in which $R^{1''}$ to $R^{3''}$ are all phenyl groups are the most preferred.

The group $R^{4''}$ represents a straight chain, branched chain, or cyclic alkyl group or fluorinated alkyl group.

As the straight chain alkyl group, groups of 1 to 10 carbon atoms are preferred, groups of 1 to 8 carbon atoms are more preferred, and groups of 1 to 4 carbon atoms are the most preferred.

Suitable cyclic alkyl groups include the same groups as those listed above in relation to the group $R^{1''}$, and cyclic groups of 4 to 15 carbon atoms are preferred, groups of 4 to 10 carbon atoms are more preferred, and groups of 6 to 10 carbon atoms are the most preferred.

As the above fluorinated alkyl group, groups of 1 to 10 carbon atoms are preferred, groups of 1 to 8 carbon atoms are more preferred, and groups of 1 to 4 carbon atoms are the most preferred. Furthermore, the fluorination ratio of the fluorinated alkyl group (the proportion of fluorine atoms in the alkyl group) is preferably within a range from 10 to 100%, and more preferably from 50 to 100%, and groups in which all of the hydrogen atoms have been substituted with fluorine atoms yield the strongest acids, and are consequently the most preferred.

The group $R^{4''}$ is most preferably a straight chain or cyclic alkyl group, or a fluorinated alkyl group.

In the formula (b-2), $R^{5''}$ to $R^{6''}$ each represents, independently, an aryl group or an alkyl group. At least one of $R^{5''}$ and $R^{6''}$ represents an aryl group. Compounds in which all of $R^{5''}$ and $R^{6''}$ are aryl groups are the most preferred.

Examples of the aryl groups of the groups $R^{5''}$ and $R^{6''}$ include the same aryl groups as those described above for the groups $R^{1''}$ to $R^{3''}$.

Examples of the alkyl groups of the groups $R^{5''}$ and $R^{6''}$ include the same alkyl groups as those described above for the groups $R^{1''}$ and $R^{3''}$.

Of the above possibilities, compounds in which $R^{5''}$ and $R^{6''}$ are all phenyl groups are the most preferred.

Examples of the group $R^{4''}$ in the formula (b-2) include the same as those described above for the group $R^{4''}$ in formula (b-1).

Specific examples of the onium salt (B2-1) include diphenyliodonium trifluoromethane sulfonate or nonafluorobutane sulfonate, bis(4-tert-butylphenyl)iodonium trifluoromethane sulfonate or nonafluorobutane sulfonate, triphenylsulfonium trifluoromethane sulfonate, heptafluoropropane sulfonate or nonafluorobutane sulfonate, tri(4-methylphenyl)sulfonium trifluoromethane sulfonate, heptafluoropropane sulfonate or nonafluorobutane sulfonate, dimethyl(4-hydroxynaphthyl)sulfonium trifluoromethane sulfonate, heptafluoropropane sulfonate or nonafluorobutane sulfonate, monophenyldimethyl sulfonium trifluoromethane sulfonate, heptafluoropropane sulfonate or nonafluorobutane sulfonate, diphenylmonomethylsulfonium trifluoromethane sulfonate, heptafluoropropane sulfonate or nonafluorobutane sulfonate, (4-methylphenyl)diphenylsulfonium trifluoromethane sulfonate, heptafluoropropane sulfonate or nonafluorobutane sulfonate, (4-methoxyphenyl)diphenylsulfonium trifluoromethane sulfonate, heptafluoropropane sulfonate or nonafluorobutane sulfonate, tri(4-tert-butyl)phenylsulfonium trifluoromethane sulfonate, heptafluoropropane sulfonate or nonafluorobutane sulfonate, and diphenyl(1-(4-methoxy)naphthyl)sulfonium trifluoromethane sulfonate, heptafluoropropane sulfonate or nonafluorobutane sulfonate. Furthermore, onium salts in which the anion portion of the above onium salts has been substituted with a methanesulfonate, n-propanesulfonate, n-butanesulfonate, or n-octanesulfonate can also be used.

In case of the component (B) including the onium salt (B2-1), the proportion of the onium salt (B2-1) in the component (B) is preferably within a range from 5 to 40% by mass, more preferably from 5 to 35% by mass, particularly preferably from 10 to 35% by mass, and most preferably from 15 to 35% by mass.

The onium salt (B2-2) is an onium salt having an anion portion represented by general formula (b-3) or (b-4).

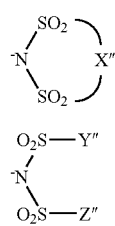

(wherein X" represents an alkylene group of 2 to 6 carbon atoms in which at least one hydrogen atom has been substituted with a fluorine atom; and Y" and Z" each represents, independently, an alkyl group of 1 to 10 carbon atoms in which at least one hydrogen atom has been substituted with a fluorine atom)

The group X" is a straight chain or branched chain alkylene group in which at least one hydrogen atom has been substituted with a fluorine atom, and the number of carbon atoms in the alkylene group is typically within a range from 2 to 6, preferably from 3 to 5, and most preferably 3.

Y" and Z" each represents, independently, a straight chain or branched chain alkyl group in which at least one hydrogen atom has been substituted with a fluorine atom, and the number of carbon atoms in the alkyl group is typically within a range from 1 to 10, preferably from 1 to 7, and most preferably from 1 to 3.

Within the above ranges for the numbers of carbon atoms, lower numbers of carbon atoms within the alkylene group X" or the alkyl groups Y" and Z" result in better solubility within the resist solvent, and are consequently preferred.

Furthermore, in the alkylene group X" or the alkyl groups Y" and Z", the larger the number of hydrogen atoms that have been substituted with fluorine atoms, the stronger the acid becomes, and the transparency relative to high energy light beams of 200 nm or less or electron beams also improves favorably. The fluorine atom proportion within the alkylene group or alkyl groups, namely the fluorination ratio, is preferably within a range from 70 to 100%, and more preferably from 90 to 100%, and perfluoroalkylene groups or perfluoroalkyl groups in which all of the hydrogen atoms have been substituted with fluorine atoms are the most preferable.

Specific examples of the onium salt (B2-2) include those in which the anion portion of the above onium salt (B2-1) has been substituted with the anion portion represented by general formula (b-3) or (b-4).

In case of the component (B) including the onium salt (B2-2), the proportion of the onium salt (B2-2) in the component (B) is preferably from 5 to 80% by mass, more preferably from 20 to 80% by mass, particularly preferably from 30 to 75% by mass, and most particularly preferable from 40 to 70% by mass.

The onium salts (B2-0) may be used either alone, or in combinations of two or more different compounds. In the present invention, it is particularly preferred to include both onium salts (B2-1) and onium salts (B2-2). The proportion of the onium salt (B2-0) in the component (B) is preferably from 45 to 95% by mass, more preferably from 45 to 85% by mass, particularly preferably from 50 to 85% by mass, and most particularly from 55 to 85% by mass.

The component (B2) may contain, in addition to the onium salt (B2-0), an acid generator (B2-3) other than the onium salt-based acid generator, and it is possible to use optional acid generators (excluding onium salt acid generators) that have conventionally been proposed as an acid generator for chemically amplified photoresists. As the acid generator (B2-3), a multitude of acid generators, for example, oxime sulfonate acid generators, diazomethane acid generators such as bisalkyl or bisarylsulfonyl diazomethanes and poly(bissulfonyl)diazomethanes, nitrobenzylsulfonate acid generators, iminosulfonate acid generators, and disulfone acid generators are known.

In the present invention, the oxime sulfonate acid generator describes a compound that contains at least one structure represented by general formula (B-1) shown below, wherein the compound generates an acid upon irradiation. These types of oxime sulfonate acid generators are widely used within chemically amplified resist compositions, and any of these compounds may be selected and used.

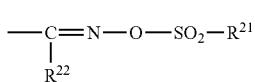
(B-1)

(wherein, in formula (B-1), $R^{21}$ and $R^{22}$ each represents, independently, an organic group)

In the present invention, an organic group is a group which includes a carbon atom and may include an atom other than a carbon atom (for example, a hydrogen atom, an oxygen atom, a nitrogen atom, a sulfur atom, or a halogen atom (fluorine atom, chlorine atom, or the like)).

The organic group represented by $R^{21}$ is preferably a straight chain, branched chain, or cyclic alkyl group or aryl group. These alkyl group and aryl group may include a substituent. There are no particular restrictions on the substituent and examples include a fluorine atom, and a straight chain, branched chain, or cyclic alkyl group of 1 to 6 carbon atoms. Herein, the expression "includes a substituent" means that either a portion of, or all of, the hydrogen atoms of the alkyl group or the aryl group are substituted with the substituent.

The alkyl group is preferably an alkyl group of 1 to 20 carbon atoms, more preferably from 1 to 10 carbon atoms, still more preferably from 1 to 8 carbon atoms, particularly preferably from 1 to 6 carbon atoms, and most preferably from 1 to 4 carbon atoms. The alkyl group is preferably an alkyl group that has been a partially or completely halogenated (hereinafter referred sometimes to as a halogentated alkyl group). The expression "alkyl group that has been partially halogenated" refers to an alkyl group in which a portion of the hydrogen atoms are substituted with halogen atoms, whereas the expression "alkyl group that has been completely halogenated" refers to an alkyl group in which all of the hydrogen atoms are substituted with halogen atoms. Examples of the halogen atom include a fluorine atom, a chlorine atom, a bromine atom, and an iodine atom, of which a fluorine atom is particularly preferable. Namely, the halogenated alkyl group is preferably a fluorinated alkyl group.

The aryl group is preferably an aryl group of 4 to 20 carbon atoms, more preferably 4 to 10 carbon atoms, and most preferably 6 to 10 carbon atoms. The aryl group is particularly preferably aryl group that has been partially or completely halogenated. The expression "aryl group that has been partially halogenated" refers to an aryl group in which a portion of hydrogen atoms are substituted with halogen atoms, whereas the expression "aryl group that has been completely halogenated" refers to an aryl group in which all of hydrogen atoms are substituted with halogen atoms.

As $R^{21}$, an alkyl group of 1 to 4 carbon atoms which includes no substituent, or a fluorinated alkyl group of 1 to 4 carbon atoms is particularly preferable.

As the organic group represented by $R^{22}$, a straight chain, branched chain, or cyclic alkyl group, aryl group or cyano group is preferred. Examples of the alkyl group or aryl group represented by $R^{22}$ include the same alkyl group or aryl group exemplified above in relation to the group $R^{21}$.

As $R^{22}$, a cyano group, an alkyl group of 1 to 8 carbon atoms which includes no substituent, or a fluorinated alkyl group of 1 to 8 carbon atoms is particularly preferable.

More preferred oxime sulfonate acid generators include compounds represented by general formula (B-2) or (B-3).

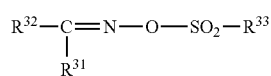
(B-2)

(wherein, in formula (B-2), $R^{31}$ is a cyano group, or an alkyl group or halogenated alkyl group which includes no substituent. $R^{32}$ is an aryl group. $R^{33}$ is an alkyl group or halogenated alkyl group which includes no substituent)

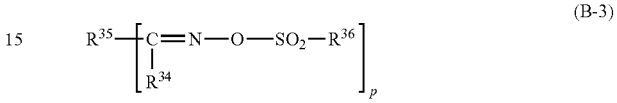
(B-3)

(wherein, in formula (B-3), $R^{34}$ is a cyano group, or an alkyl group or halogenated alkyl group which includes no substituent, $R^{35}$ is a di- or trivalent aromatic hydrocarbon group, $R^{36}$ is an alkyl group or halogenated alkyl group which includes no substituent, and p is either 2 or 3]

In general formula (B-2) shown above, the alkyl group or halogenated alkyl group including no substituent group represented by $R^{31}$ is preferably a group of 1 to 10 carbon atoms, more preferably 1 to 8 carbon atoms, and most preferably 1 to 6 carbon atoms.

$R^{31}$ is preferably a halogenated alkyl group, and more preferably a fluorinated alkyl group.

In the fluorinated alkyl group represented by $R^{31}$, groups in which 50% or more of the hydrogen atoms in the alkyl group are fluorinated are preferable, groups in which 70% or more of the hydrogen atoms in the alkyl group are fluorinated are more preferable, and groups in which 90% or more of the hydrogen atoms in the alkyl group are fluorinated are still more preferable.

Examples of the aryl group represented by $R^{32}$ include groups in which one hydrogen atom has been removed from the ring of the aromatic hydrocarbon, such as a phenyl group, a biphenyl group, a fluorenyl group, a naphthyl group, an anthracyl (anthryl) group, and a phenanthryl group; and heteroaryl groups in which a portion of the carbon atoms that form the ring of these groups has been substituted with a hetero atom such as an oxygen atom, a sulfur atom, or a nitrogen atom. Of these groups, a fluorenyl group is preferred.

The aryl group represented by $R^{32}$ may include a substituent such as an alkyl group of 1 to 10 carbon atoms, a halogenated alkyl group, or an alkoxy group. The alkyl group or the halogenated alkyl group in the substituent is preferably a group of 1 to 8, and more preferably 1 to 4 carbon atoms. The halogenated alkyl group is preferably a fluorinated alkyl group.

The alkyl group or halogenated alkyl group represented by $R^{33}$ which includes no substituent is preferably a group of 1 to 10 carbon atoms, more preferably 1 to 8 carbon atoms, and most preferably 1 to 6 carbon atoms.

$R^{33}$ is preferably a halogenated alkyl group, or an alkyl group that has been partially or completely fluorinated.

In the fluorinated alkyl group represented by $R^{33}$, groups in which 50% or more of the hydrogen atoms in the alkyl group are fluorinated are preferable, groups in which 70% or more of the hydrogen atoms in the alkyl group are fluorinated are more preferable, and groups in which 90% or more of the hydrogen atoms in the alkyl group are fluorinated are still more preferable because they increase the strength of the acid that is generated. Completely fluorinated alkyl groups in which 100% of the hydrogen atoms have been substituted with fluorine atoms are the most preferable.

In general formula (B-3) shown above, examples of the alkyl group or halogenated alkyl group represented by $R^{34}$ which includes no substituent include the same alkyl group or halogenated alkyl group represented by $R^{31}$ which includes no substituent.

Examples of the di- or trivalent aromatic hydrocarbon group represented by $R^{35}$ include groups in which one or two hydrogen atoms have been removed furthermore from the aryl group represented by $R^{32}$.

Examples of the alkyl group or halogenated alkyl group represented by $R^{36}$ which includes no substituent include the same alkyl group or halogenated alkyl group represented by $R^{33}$ which includes no substituent.

p is preferably 2.

Specific examples of the oxime sulfonate-based acid generators include α-(p-toluenesulfonyloxyimino)-benzylcyanide, α-(p-chlorobenzenesulfonyloxyimino)-benzylcyanide, α-(4-nitrobenzenesulfonyloxyimino)-benzylcyanide, α-(4-nitro-2-trifluoromethylbenzenesulfonyloxyimino)-benzylcyanide, α-(benzenesulfonyloxyimino)-4-chlorobenzylcyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)-benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further examples include the compounds represented by the chemical formulas shown below.

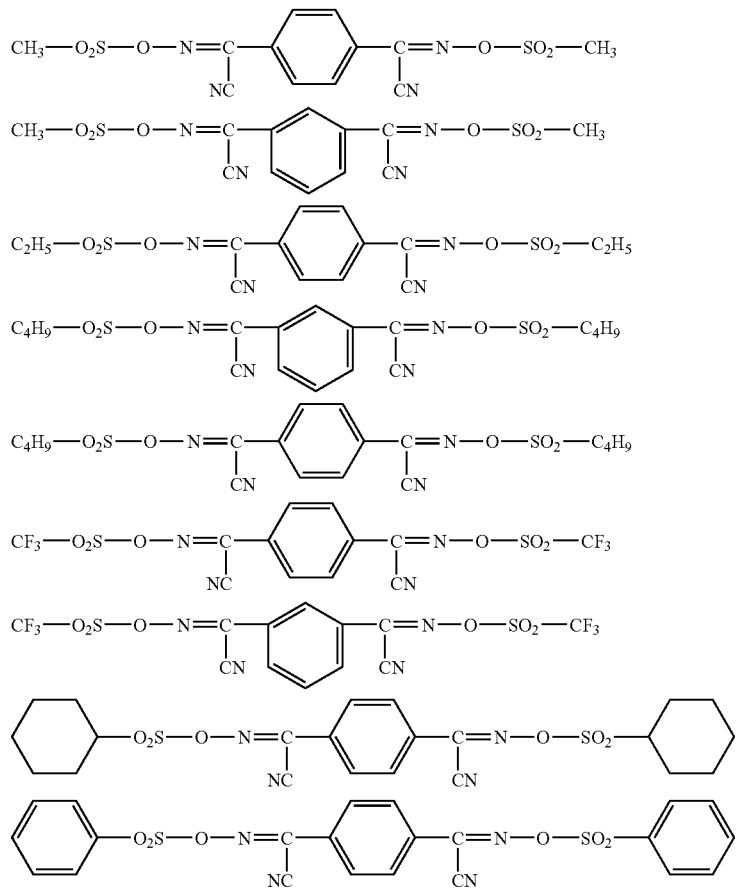

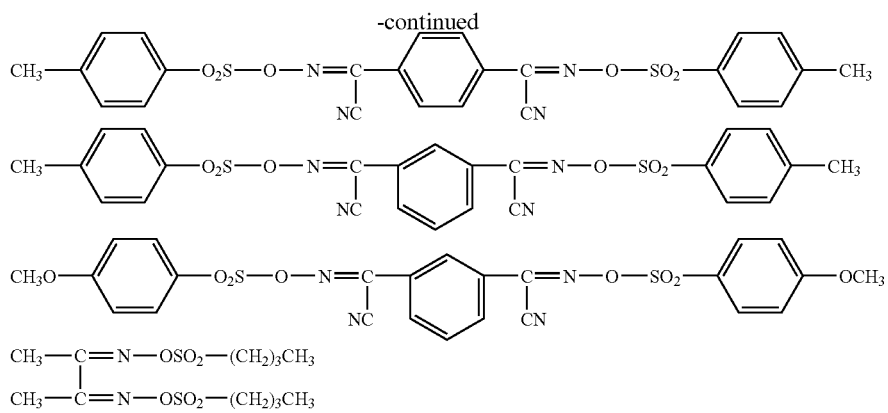
Of the compounds represented by the above general formulas (B-2) and (B-3), examples of preferred compounds include those shown below.
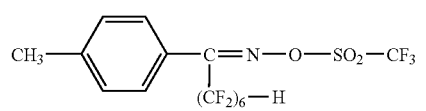
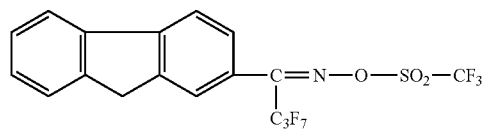
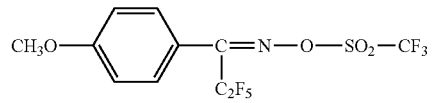
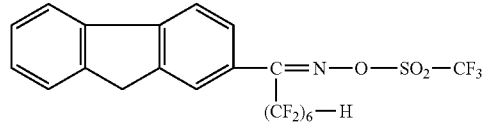
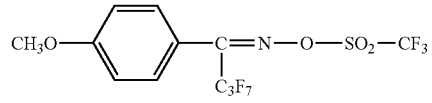
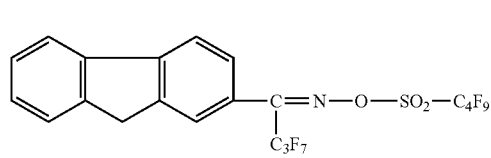
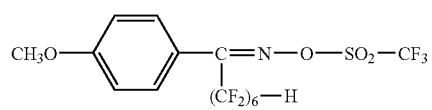
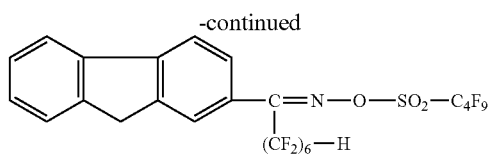
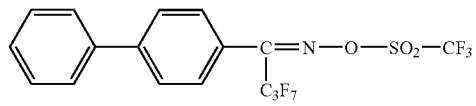
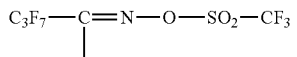
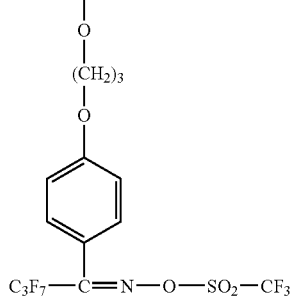
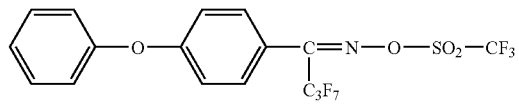
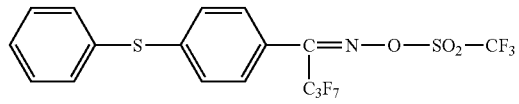
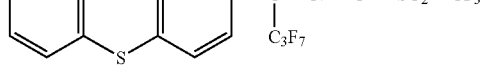

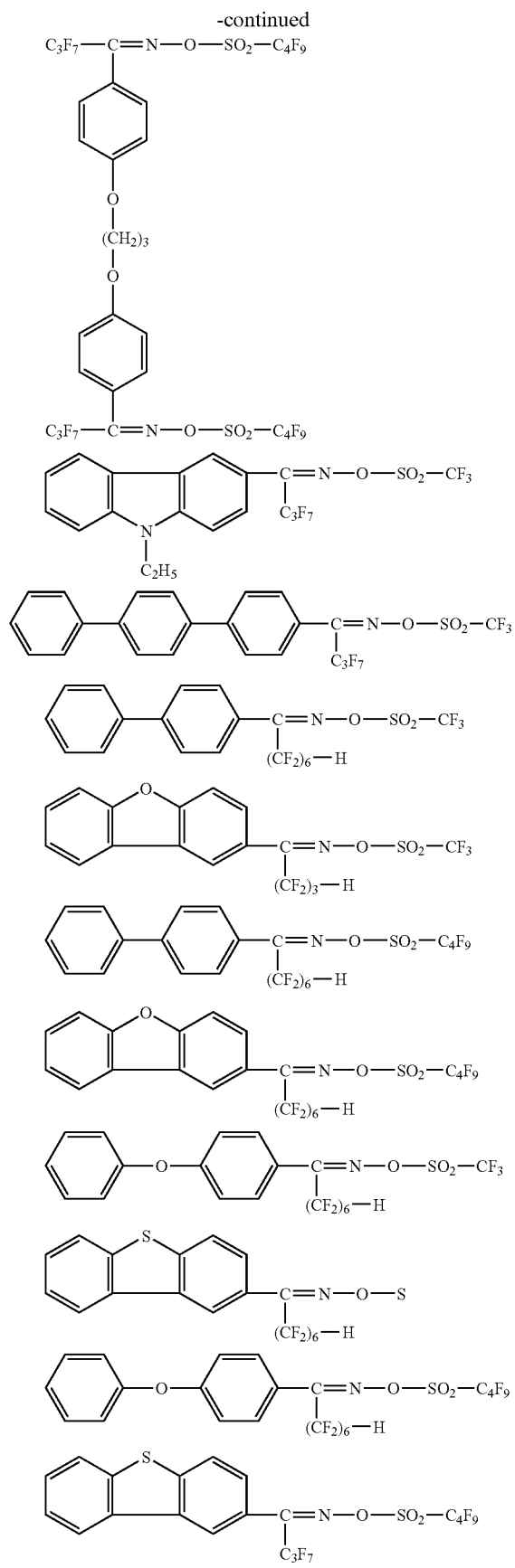

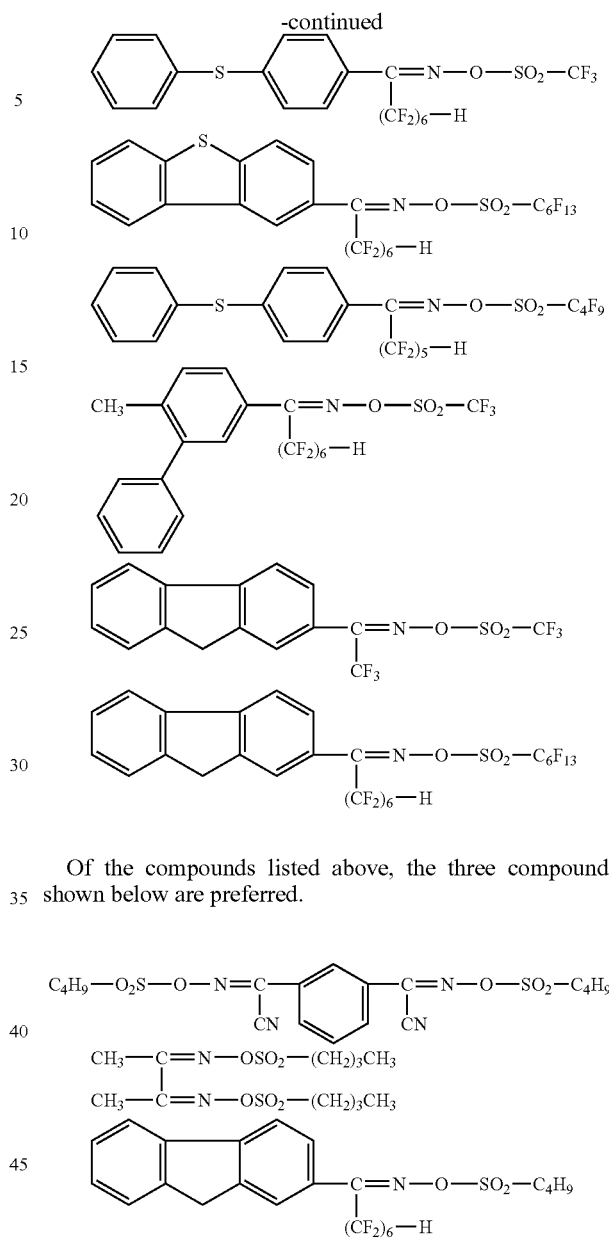

Of the compounds listed above, the three compounds shown below are preferred.

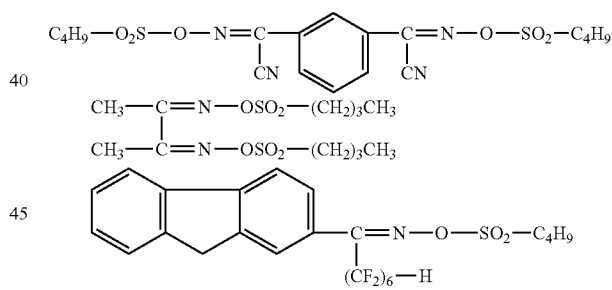

Of the diazomethane acid generators, specific examples of bisalkyl or bisarylsulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Examples of poly bissulfonyl)diazomethanes include those having structures shown below, such as 1,3-bis(phenylsulfonyl diazomethylsulfonyl)propane (in case of A=3), 1,4-bis(phenylsulfonyl diazomethylsulfonyl)butane (in case of A=4), 1,6-bis(phenylsulfonyl diazomethylsulfonyl)hexane (in case of A=6), 1,10-bis(phenylsulfonyl diazomethylsulfonyl)decane (in case of A=10), 1,2-bis(cyclohexylsulfonyl diazomethylsulfonyl)ethane (in case of B=2), 1,3-bis(cyclohexylsulfonyl diazomethylsulfonyl)propane (in case of B=3), 1,6-bis(cyclohexylsulfonyl diazomethylsulfonyl)hexane (in case of B=6), and 1,10-bis(cyclohexylsulfonyl diazomethylsulfonyl)decane (in case of B=10).

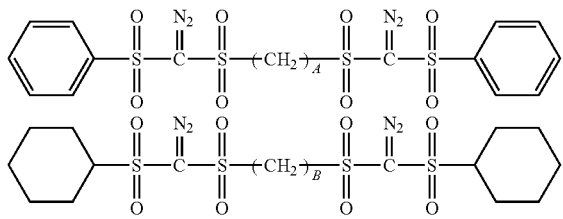

In the present invention, it is preferred to use, as the component (B2), an onium salt containing fluorinated alkylsulfonic acid ions as an anion.

Of these onium salts, a sulfonium salt is preferable.

Furthermore, the sulfonium salt is preferably a sulfonium salt containing at least one group selected from phenyl groups in which the cation portion may be substituted with a substituent such as a straight chain or branched chain lower alkyl group of 1 to 5 carbon atoms or a straight chain or branched chain lower alkoxy group of 1 to 5 carbon atoms, and naphthyl groups which may be substituted with the substituents shown above, and it is particularly preferred that at least two of these groups are phenyl groups which include no substituent.

Of these compounds, a compound represented by chemical formula (b-0-2) and a compound represented by chemical formula (b-0-3) are preferred.

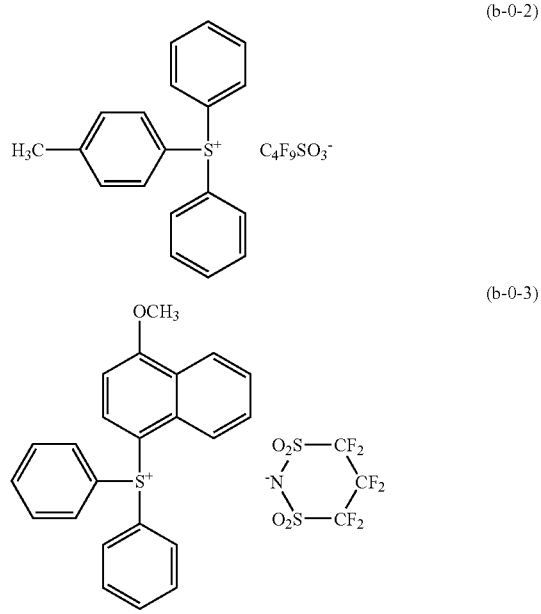

The components (B2) can be used either alone, or in combinations of two or more different components.

The amount of the component (B2) in the component (B) is preferably from 45 to 95% by mass, more preferably from 45 to 85% by mass, particularly preferably from 50 to 85% by mass, and most preferably from 55 to 85% by mass.

The content of the entire component (B) is from 0.5 to 30 parts by mass, preferably from 1 to 20 parts by mass, and more preferably from 5 to 15 parts by mass, based on 100 parts by mass of the component (A). Ensuring that the content is within the above range enables sufficient carrying out of pattern formation. It is preferred because a uniform solution is obtained and storage stability is improved Nitrogen-containing Organic Compound (D)

In a positive resist composition of the present invention, in order to improve the resist pattern shape and the post exposure stability (post exposure stability of the latent image formed by the pattern-wise exposure of the resist layer), it is possible to add, as an optional component, a nitrogen-containing organic compound (D) (hereinafter referred to as component (D)).

A multitude of these components (D) have already been proposed, and any of these known compounds may be used, although an amine, and particularly a secondary lower aliphatic amine or a tertiary lower aliphatic amine is preferred.

Examples of the aliphatic amine include amines in which at least one of the hydrogen atoms of ammonia ($NH_3$) is substituted with an alkyl group or hydroxyalkyl group of 12 or less carbon atoms (alkylamine or alkyl alcoholamine). Specific examples include monoalkylamines such as n-hexylamine, n-heptylamine, n-octylamine, n-nonylamine, or n-decylamine; dialkylamines such as diethylamine, di-n-propylamine, di-n-heptylamine, di-n-octylamine, or dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, or tri-n-dodecylamine; and alkyl alcoholamines such as diethanolamine, triethanolamine, diisopropanolamine, triisopropanolamine, di-n-octanolamine, or tri-n-octanolamine. Of these aliphatic amines, an alkylalcoholamine and a trialkylamine are preferred and an alkyl alcoholamine is most preferred. Of the alcoholamines, triethanolamine and triisopropanolamine are most preferred.

These amines can be used either alone, or in combinations of two or more different amines.

The component (D) is usually used in an amount within a range from 0.01 to 5.0 parts by mass per 100 parts by mass of the component (A).

Component (E)

Furthermore, in order to prevent any deterioration in sensitivity caused by the addition of the above component (D), and improve the resist pattern shape and post exposure stability (post exposure stability of the latent image formed by the pattern-wise exposure of the resist layer), an organic carboxylic acid, or a phosphorus oxo acid or derivative thereof (E) (hereafter referred to as a component (E)) may also be added to the resist composition as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

Organic Solvent

The resist composition can be produced by dissolving the materials in an organic solvent.

The organic solvent may be any solvent capable of dissolving the various components used to generate a uniform solution, and one or more solvents selected from known materials used as the solvents for conventional chemically amplified resists can be used.

Specific examples of the solvent include lactones such as γ-butyrolactone; ketones such as acetone, methyl ethyl ketone, cyclohexanone, methyl isoamyl ketone, and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate, and propylene glycol monomethyl ether acetate (PGMEA); cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

Furthermore, methyl amyl ketone (Methyl n-Amyl Ketone; hereinafter abbreviated to MAK) is preferably used since there is excellent solubility of the component to be dissolved in the organic solvent.

These organic solvents may be used either alone, or as a mixed solvent of two or more different solvents.

Furthermore, mixed solvents produced by mixing propylene glycol monomethyl ether acetate (PGMEA) with a polar solvent are preferred. Although the blend ratio (mass ratio) in such mixed solvents can be set in accordance with factors such as the co-solubility of the PGMEA and the polar solvent, the ratio is preferably within a range from 1:9 to 9:1, and is even more preferably from 2:8 to 8:2.

More specifically, in those cases where EL is added as the polar solvent, the mass ratio PGMEA:EL is preferably within a range from 1:9 to 9:1, and is even more preferably from 2:8 to 8:2.

Furthermore, as the organic solvent, mixed solvents containing at least one of PGMEA and EL, together with γ-butyrolactone, are also preferred. In such cases, the weight ratio of the former and latter components in the mixed solvent is preferably within a range from 70:30 to 95:5.

MAK is preferably used as a mixed solvent with, for example, propylene glycol monomethyl ether (PGMEA), in view of solubility of the material. The mass ratio GMEA:MAK is from 9:1 to 1:9, preferably from 8:2 to 2:8, more preferably from 8:2 to 4:6, and most preferably from 7:3 to 5:5.

There are no particular restrictions on the quantity used of the organic solvent, although the quantity should be set in accordance with the coating film thickness required, at a concentration that enables favorable application of the solution to a substrate or the like. Typically, the quantity of solvent is set so that the solid fraction concentration of the resist composition falls within a range from 2 to 20% by mass, and preferably from 5 to 15% by mass.

Other Optional Components

Other miscible additives can also be added to the resist composition according to need, and examples include additive resins for improving the properties of the resist film, surfactants for improving the coating properties, dissolution inhibitors, plasticizers, stabilizers, colorants, halation prevention agents, and dyes.

[Method for Forming a Resist Pattern]

The method for forming a resist pattern of the present invention includes the steps of forming a resist film on a substrate using a resist composition of the present invention; selectively exposing said resist film; and alkali-developing said resist film, thereby forming a resist pattern.

The resist pattern forming method of the present invention can be conducted in the following manner.

Namely, the above positive resist composition is first applied to a substrate such as a silicon wafer using a spin coater or the like, and prebaking is then conducted under temperature conditions of 80 to 150° C., for a period of 40 to 120 seconds, and preferably for 60 to 90 seconds, thus forming a resist film. This resist film is selectively exposed with an ArF exposure apparatus or the like, by irradiating ArF excimer laser light through a desired mask pattern, and PEB (post exposure baking) is then conducted under temperature conditions of 80 to 150° C., for a period of 40 to 120 seconds, and preferably for 60 to 90 seconds. Subsequently, a developing treatment is conducted using an alkali developing solution such as a 0.1 to 10% by mass aqueous solution of tetramethylammonium hydroxide. In this manner, a resist pattern that is faithful to the mask pattern can be obtained.

An organic or inorganic anti-reflective film may also be provided between the substrate and the applied layer of the resist composition.

There are no particular restrictions on the wavelength used for the exposure, and an ArF excimer laser, KrF excimer laser, $F_2$ excimer laser, or other radiation such as EUV (extreme ultraviolet), VUV (vacuum ultraviolet), EB (electron beam), X-ray or soft X-ray radiation can be used. The present invention is particularly effective for use with an ArF excimer laser.

In the present invention, it is possible to provide a chemically amplified positive resist composition which enables formation of a pattern having a favorable shape, and a method for forming a resist pattern.

Also, line edge roughness ((LER) heterogeneous irregularity of line side wall) characteristics are also excellent.

In the prior art, the shape tends to deteriorate when the amount of an acid generator component increases so as to improve LER, whereas, in the positive resist composition of the present invention, since the shape hardly deteriorates when an amount of an acid generator component increases, satisfactory shape can be compatible with excellent LER characteristics.

Furthermore, the resolution is also excellent.

Furthermore, the component (B1) also has excellent in heat resistance and is satisfactory in this respect.

Furthermore, separate margin (evaluation of a relation between light exposure and separation of a pattern) is also improved.

Furthermore, regarding pattern collapse, exposure margin and depth of focus, it is possible to obtain characteristics suitable for practical use.

Since lithography characteristics are entirely improved with good balance, the resulting chemically amplified positive resist composition is fit for various uses.

Although the reason why these characteristics are obtained is not sure, it is considered that the component (B1) has a structure in which the cation portion includes only one aryl group, thus improving transparency to ArF excimer laser light. Also it is considered that the component does not have a bulky structure.

As a result, the shape can be improved. It is considered that, even if the amount of the acid generator component increases, LER does not deteriorate and also a multitude of characteristics such as resolution are improved.

EXAMPLES

Synthesis Example 1

A mixture (0.1 mols) of 2-ethyl-2-adamantyl methacrylate, norbornanelactone methacrylate, and 3-hydroxy-1-adamantyl methacrylate was dissolved in 150 ml of THF (tetrahydrofuran) and radical polymerization was initiated at 70° C. using AIBN (4 mol % per 100 mol % of the monomer). As a chain transfer agent for polymerization, a compound represented by the chemical formula shown below:

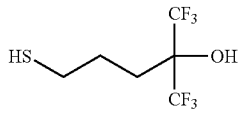

was added in an amount of 3 mol % per 100 mol % of the total amount of the above monomers charged and AIBN and then the polymerization reaction was conducted. After the completion of the polymerization reaction, the reaction solution was poured into 2,000 ml of n-heptane, followed by stirring at 25° C. for 30 minutes. The precipitated solid was collected by filtration. The resulting solid was dissolved again in 200 ml of THF, poured into 2,000 ml of n-heptane, followed by stirring at 25° C. for 30 minutes. The precipitated solid was collected by filtration. The resulting solid was dried to obtain a resin A represented by the chemical formula shown below. In the chemical formula shown below, n/m/l=40/40/20 (molar ratio). The resin A had a weight average molecular weight of 6,000 and a dispersion degree (weight average molecular weight/number average molecular weight) of 1.6.

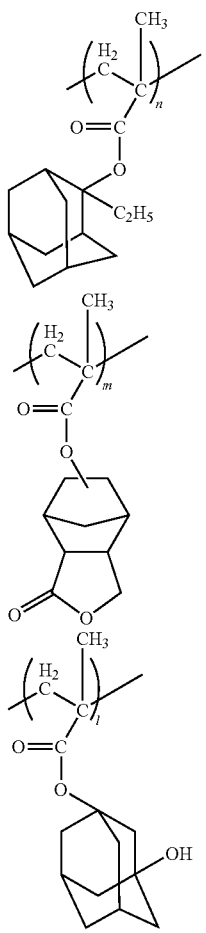

Resin A

Example 1

100 Parts by mass of the resin A obtained in Synthesis Example 1, a component (B1), a component (B2), a component (D), and an organic solvent were mixed in each amount described in Table 1 shown below to prepare a positive resist composition. The unit of a numerical value in parenthesis is "parts by mass".

TABLE 1

| | | Component (B) | | | | |
| | | | Component (B2) | | | |
| | Component (A) | Component (B1) | Component (B2-1) | Component (B2-2) | Component (D) | Organic solvent |
|---|---|---|---|---|---|---|
| Example 1 | Resin A [100] | (b-0-1) [5.0] | (b-0-2) [1.6] | — | Triethanolamine [0.48] | S1 [750] |
| Example 2 | Resin A [100] | (b-0-1) [2.0] | (b-0-2) [1-6] | (b-0-3) [6.0] | Triethanolamine [0.58] | S1 [750] |
| Example 3 | Resin A [100] | (b-0-1) [4.5] | — | (b-0-3) [6.0] | Triethanolamine [0.48] | S1 [750] |
| Comparative Example 1 | Resin A [100] | — | (b-0-2) [1-6] | (b-0-3) [6.0] | Triethanolamine [0.48] | S1 [750] |

(b-0-1) in Table 1 is a compound represented by the chemical formula shown below.

(b-0-2) in Table 1 is a compound represented by the chemical formula shown below.

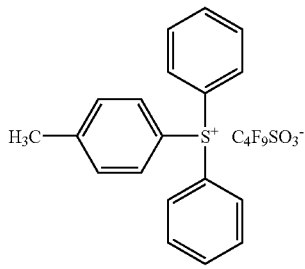

(b-0-3) in Table 1 is a compound represented by the chemical formula shown below.

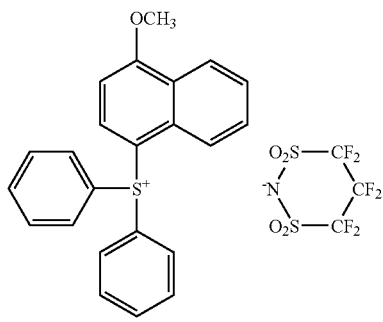

S1 in Table 1 is a mixed solvent prepared by mixing PGMEA with MAK in a mass ratio of 6/4.

Then, a composition for an organic anti-reflective film was applied on an 8 inch silicone wafer using a spinner and then dried by firing on a hot plate at 200° C. for 90 seconds, thus forming an organic anti-reflective film with a film thickness of 44 nm. The above positive resist composition was applied on the organic anti-reflective film using a spinner and then dried by prebaking (PAB) on a hot plate at 100° C. for 90 seconds, thus forming a resist layer with a film thickness of 130 nm.

Then, the thus obtained resist layer was selectively exposed to an ArF excimer laser (193 nm) through a 6% half tone rectile, using ArF exposure apparatus NSR-S306C (manufactured by Nikon Corporation; NA (numerical aperture)=0.78, 2/3 annual illumination).

After a PEB treatment was conducted at 105° C. for 90 seconds, the resist film was subjected to puddle development for 45 seconds at 23° C. in a 2.38% by weight aqueous solution of tetramethylammonium hydroxide, and was then rinsed for 20 seconds with pure water, shaken dry and dried by heating at 100° C. for 60 seconds, completing formation of a 85 nm line and space (1:1) pattern (hereafter referred to as a L/S pattern) In that case, the sensitivity was taken as Eop.

The following characteristics were evaluated.

<Sensitivity>

An optimum light exposure at which an 85 nm L/S pattern was measured as the sensitivity (Eop) using the unit mJ/cm² (energy quantity).

<Pattern Shape>

Profile of a pattern thus formed was evaluated using a SEM (scanning electron microscope. The results are shown in Table 2.
A: Extremely excellent rectangularity
B: Excellent rectangularity
C: Footing shape, T-TOP shape

<LER>

With respect to the 85 nm L/S pattern obtained at Eop, as evaluation of line edge roughness (LER) in which the side wall surface of a line pattern becomes heterogeneous, 3σ as an indicator of LER was determined. 3σ is a value, which is three times as larger than the standard deviation (σ), obtained by measuring a width of a resist pattern of a sample at 32 positions using a measuring SEM (manufactured by Hitachi, Ltd. under the trade name "S-9220") and calculating from the obtained results. As the value of 3σ becomes smaller, the roughness becomes smaller, thus obtaining a resist pattern having a uniform width. The results are shown in Table 2 below.

<Separate Margin>

In selective exposure, the exposure time gradually increased from light exposure smaller than Eop (light exposure increased) to form a pattern with respect to each light exposure. Then, it was observed at what point of light exposure a pattern is separated using SEM. "Separate margin" determined by the equation shown below is shown in Table 2.

"Separate margin" (%)=100−(Es/Eop×100)

Es: sensitivity (mJ/cm²) when a pattern is separated (energy quantity)

<Depth of Focus (DOF)>

In the Eop at which the L/S pattern is formed, a reticle depth was appropriately shifted and a resist pattern was formed in the same manner as described above, and then a width (μm) of the reticle depth, at which each pattern can be formed without causing pattern collapse, was determined. The results are shown in Table 2.

Examples 2 and 3, and Comparative Example 1

According to the formulations shown in Table 1, resist compositions were prepared and were evaluated in the same manner as in Example 1. The results are shown in Table 2.

TABLE 2

| | Eop (mJ/cm²) | Es (mJ/cm²) | Pattern shape | LER (nm) | Separate margin (%) | DOF (μm) |
|---|---|---|---|---|---|---|
| Example 1 | 51.5 | 44 | B | 6.7 | 14.6 | 0.6 |
| Example 2 | 53 | 44 | A | 6.2 | 17 | 0.5 |
| Example 3 | 53 | 45.5 | B | 5.4 | 14.2 | 0.4 |
| Comparative Example 1 | 47 | 41 | C | 6.4 | 12.8 | 0.4 |

With respect to the respective Examples and Comparative Examples, exposure margin and depth of focus were measured. As a result, they exhibited the same or more superior characteristics. Furthermore, collapse margin* was evaluated. As a result, it was sufficiently fit for practical use.

*Collapse margin (%)=$Ec/Eop \times 100$

Ec: light exposure (mJ/cm$^2$) at which pattern collapse occurs when light exposure increases from Eop (energy quantity)

It could be confirmed by these Examples that a pattern with a favorable shape can be formed in the Examples of the present invention.

Furthermore, LER was the same or more superior.

Furthermore, separate margin was excellent.

INDUSTRIAL APPLICABILITY

The present invention can provide a chemically amplified positive resist composition which enables formation of a pattern having a favorable shape, and a method for forming a resist pattern.

The invention claimed is:

1. A positive resist composition, comprising:
a resin component (A) which contains an acid dissociable, dissolution inhibiting group and exhibits increased alkali solubility under an action of an acid; and
an acid generator component (B) which generates an acid upon exposure and includes an acid generator (B1) represented by general formula (B1):

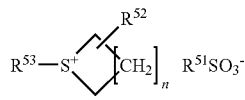

(B1)

(wherein R$^{51}$ represents a straight chain, branched chain, or cyclic alkyl group, or a straight chain, branched chain, or cyclic fluorinated alkyl group; R$^{52}$ represents a hydrogen atom, a hydroxyl group, a halogen atom, a straight chain, branched chain, or cyclic alkyl group, a straight chain or branched chain halogenated alkyl group, or a straight chain or branched chain alkoxy group; and R$^{53}$ represents either a phenyl group or a phenyl group with a lower alkyl group having no more than 5 carbon atoms as a substituent; and wherein n represents an integer of 3).

2. A positive resist composition according to claim 1, wherein said component (B) further includes an acid generator (B2) besides said component (B1).

3. A positive resist composition according to claim 1, further comprising: a nitrogen-containing organic compound (D).

4. A positive resist composition according to claim 2, further comprising: a nitrogen-containing organic compound (D).

5. A method for forming a resist pattern, comprising the steps of:
forming a resist film on a substrate using a positive resist composition according to any one of claims 1 to 4;
selectively exposing said resist film; and
alkali-developing said resist film, thereby forming a resist pattern.

6. A positive resist composition according to claim 1, wherein the content of the component (B1) in the component (B) is from 10 to 85% by mass.

7. A positive resist composition according to claim 2, wherein the acid generator (B2) includes an onium salt (B2-2) which is an onium salt having an anion portion represented by general formula (b-3) or (b-4) shown below:

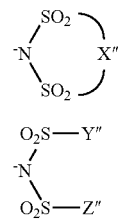

(b-3)

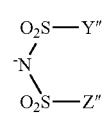

(b-4)

(wherein X" represents an alkylene group of 2 to 6 carbon atoms in which at least one hydrogen atom has been substituted with a fluorine atom; and Y" and Z" each represent, independently, an alkyl group of 1 to 10 carbon atoms in which at least one hydrogen atom has been substituted with a fluorine atom).

8. A positive resist composition according to claim 2, wherein the acid generator (B2) includes an onium salt (B2-1) and an onium salt (B2-2), the onium salt (B2-1) include compounds represented by general formulas (b-1) or (b-2) shown below, and the onium salt (B2-2) is an onium salt having an anion portion represented by general formula (b-3) or (b-4) shown below:

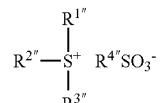

(b-1)

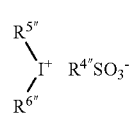

(b-2)

(wherein R$^{1''}$ to R$^{3''}$, and R$^{5''}$ and R$^{6''}$ each represent, independently, an aryl group or an alkyl group; and R$^{4''}$ represents a straight chain, branched chain, or cyclic alkyl group or fluorinated alkyl group; provided that at least one of R$^{1''}$ to R$^{3''}$ represents an aryl group, and at least one of R$^{5''}$ and R$^{6''}$ represents an aryl group):

(b-3)

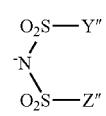

(b-4)

(wherein X" represents an alkylene group of 2 to 6 carbon atoms in which at least one hydrogen atom has been substituted with a fluorine atom; and Y" and Z" each represent, independently, an alkyl group of 1 to 10 carbon atoms in which at least one hydrogen atom has been substituted with a fluorine atom).

9. A positive resist composition according to claim 1, wherein R$^{53}$ represents a phenyl group with no substituent.

10. A positive resist composition according to claim 1, wherein R$^{53}$ represents a phenyl group substituted with a methyl group.

* * * * *